United States Patent
Konnai et al.

(10) Patent No.: US 9,917,238 B2
(45) Date of Patent: Mar. 13, 2018

(54) THERMOELECTRIC ELEMENT AND THERMOELECTRIC MODULE PROVIDED WITH SAME

(71) Applicant: KELK Ltd., Hiratsuka-shi, Kanagawa (JP)

(72) Inventors: Mitsuoki Konnai, Hiratsuka (JP); Akio Konishi, Hiratsuka (JP)

(73) Assignee: KELK LTD., Kanagawa (JP)

( * ) Notice: Subject to any disclaimer, the term of this patent is extended or adjusted under 35 U.S.C. 154(b) by 522 days.

(21) Appl. No.: 14/371,880

(22) PCT Filed: Dec. 10, 2012

(86) PCT No.: PCT/JP2012/081984
§ 371 (c)(1),
(2) Date: Jul. 11, 2014

(87) PCT Pub. No.: WO2013/108518
PCT Pub. Date: Jul. 25, 2013

(65) Prior Publication Data
US 2014/0345666 A1 Nov. 27, 2014

(30) Foreign Application Priority Data
Jan. 16, 2012 (JP) .................... 2012-006440

(51) Int. Cl.
*H01L 35/02* (2006.01)
*H01L 35/28* (2006.01)
(Continued)

(52) U.S. Cl.
CPC ............. *H01L 35/10* (2013.01); *H01L 35/08* (2013.01); *H01L 35/32* (2013.01); *H01L 35/34* (2013.01)

(58) Field of Classification Search
CPC ...................................... H01L 35/10
(Continued)

(56) References Cited

U.S. PATENT DOCUMENTS

| 4,855,810 A * | 8/1989 | Gelb ..................... H01L 35/08 136/203 |
| 2008/0135082 A1 | 6/2008 | Hirono et al. |
| 2009/0174052 A1* | 7/2009 | Sogawa ............ H01L 23/49816 257/690 |

FOREIGN PATENT DOCUMENTS

| CN | 101080824 A | 11/2007 |
| JP | 6-310765 A | 11/1994 |

(Continued)

OTHER PUBLICATIONS

The International Search Report for the corresponding international application No. PCT/JP2012/081984, dated Feb. 12, 2013.
(Continued)

*Primary Examiner* — Angelo Trivisonno
(74) *Attorney, Agent, or Firm* — Global IP Counselors, LLP

(57) ABSTRACT

A thermoelectric element includes a p-type/n-type semiconductor element having an upper end surface and a lower end surface, a lower electrode that is joined to the lower end surface of the p-type/n-type semiconductor element to connect the p-type/n-type semiconductor element and another n-type/p-type semiconductor element adjacently thereto and has an area less than that of the lower end surface in a joint region therebetween. A joint portion is made of a solder and has a surface joint part joining the lower end surface of the p-type/n-type semiconductor element and a surface of the lower electrode while the lower end surface of the p-type/n-type semiconductor element and the surface of the lower electrode are opposed to each other A fillet part is formed to fill a space produced between intersecting surfaces, i.e., the (Continued)

lower end surface and a lateral side of the lower electrode, and composes a step part formed by the lower end surface and the lower electrode.

20 Claims, 17 Drawing Sheets

(51) Int. Cl.
    *H01L 35/10*     (2006.01)
    *H01L 35/08*     (2006.01)
    *H01L 35/32*     (2006.01)
    *H01L 35/34*     (2006.01)

(58) Field of Classification Search
    USPC .................................................. 136/212, 230
    See application file for complete search history.

(56) References Cited

FOREIGN PATENT DOCUMENTS

| | | |
|---|---|---|
| JP | 10-225791 A | 8/1998 |
| JP | 2000-101152 A | 4/2000 |
| JP | 2000-349352 A | 12/2000 |
| JP | 2004-228230 A | 8/2004 |
| JP | 2004-259770 A | 9/2004 |
| JP | 2006-278405 A | 10/2006 |
| JP | 2007-48916 A | 2/2007 |
| JP | 2011-3559 A | 1/2011 |

OTHER PUBLICATIONS

Office Action for the corresponding Chinese application No. 201280066552.1, dated Feb. 3, 2016.

\* cited by examiner (a)

(b)

(a)

(b)

(a)

(b)

(a)

(b)

(a)

(b)

(a)

(b)

(a)

(b)

(a)

(b)

(a)

(b)

THERMOELECTRIC ELEMENT AND THERMOELECTRIC MODULE PROVIDED WITH SAME

CROSS-REFERENCE TO RELATED APPLICATIONS

This application is a U.S. National stage application of International Application No. PCT/JP2012/081984, filed on Dec. 10, 2012. This U.S. National stage application claims priority under 35 U.S.C. § 119(a) to Japanese Patent Application No. 2012-006440, filed in Japan on Jan. 16, 2012, the entire contents of which are hereby incorporated herein by reference.

BACKGROUND

Field of the Invention

The present invention relates to a thermoelectric element made of a semiconductor material having the Peltier effect or the Seebeck effect and a thermoelectric module provided with the same.

Background Information

Devices utilizing so-called the Peltier effect have been used in recent years. In the devices, when electric current is applied in a predetermined direction to a thermoelectric element including p-type and n-type semiconductor elements joined through a pair of electrodes, heat generation is caused on one end part of the thermoelectric element whereas heat absorption is caused on the other end part of the thermoelectric element.

For example, Japan Laid-open Patent Application Publication No. JP-A-2007-48916 (disclosed on Feb. 22, 2007) discloses a structure of a thermoelectric module intended to provide a compact thermoelectric module with a large endothermic amount. In the structure, the width of a p-type thermoelectric element and that of an n-type thermoelectric element are designed to be greater than the width of a lower electrode and that of an upper electrode, while the p-type thermoelectric element and the n-type thermoelectric element are disposed to protrude from the lower electrode and the upper electrode in an alignment direction on the electrodes and in a direction perpendicular to the alignment direction.

SUMMARY

However, the aforementioned conventional thermoelectric module has a drawback as follows.

In short, the aforementioned publication mentions that in the thermoelectric module, a joint plane between each p-type/n-type thermoelectric element and each electrode includes a part in which the size of each electrode is less than that of each p-type/n-type thermoelectric element. However, the aforementioned publication does not mention the shape of solder for joining the respective thermoelectric elements and the respective electrodes.

Therefore, chances are that regarding a plurality of thermoelectric elements composing a thermoelectric module (especially, thermoelectric elements disposed on the outer side), where solder is formed in some sort of shape, stress inevitably concentrates on, and on the vicinity of, the joined parts of each thermoelectric element to the electrodes and this results in damage or fracture of each thermoelectric element when a large difference in temperature is caused between a first surface side and a second surface side of each thermoelectric element, and accordingly, distortion is caused in the entire thermoelectric module due to expansion on the high temperature side and shrinkage on the low temperature side.

It is an object of the present invention to provide a thermoelectric element that can be prevented from being damaged or fractured by avoiding stress concentration on a semiconductor element even when difference in temperature is caused in the thermoelectric module and this results in distortion of the thermoelectric module, and a thermoelectric module provided with the same.

A thermoelectric element according to a first exemplary embodiment of the present invention includes an element portion, a pair of electrodes and a joint portion. The element portion is made of a semiconductor material having either the Peltier effect or the Seebeck effect and has a first surface and a second surface disposed oppositely to the first surface. The pair of electrodes is joined to the first surface and the second surface of the element portion to connect the element portion and other element portions disposed adjacently to the element portion. Each of the electrodes has an area less than an area of the relevant first or second surface in a joint region between each electrode and the relevant first or second surface. The joint portion is made of solder, and has a surface joint part and a fillet part. The surface joint part joins the first or second surface of the element portion and a surface of the relevant electrode while the first or second surface of the element portion and the surface of the relevant electrode are opposed to each other. The fillet part composes a step part formed by the first or second surface and the relevant electrode, and is formed to fill a space that is produced between the first or second surface and a lateral side of the relevant electrode.

Here, in the thermoelectric module in which the electrodes are respectively joined to surfaces, i.e., one surface (the first surface) and the other surface (the second surface) disposed oppositely to the one surface, of the element portion made of a semiconductor material having so-called the Peltier effect, each electrode joined to the first/second surface of the element portion has an area less than that of the first/second surface of the element portion in the joint plane thereof. Each electrode is disposed to be covered with the element portion on the joint plane thereof in a plan view seen in a direction perpendicular to the joint plane. Further, in the joint region between the first or second surface and the relevant electrode, the fillet part made of solder is provided between the lateral side of the relevant electrode and the surface of the step part of the element portion, i.e., a part extending from the relevant electrode.

The term fillet herein refers to a part made of solder extending from each electrode in joining the element portion and each electrode.

Thus, with the shape of the aforementioned fillet part, it is possible to avoid a situation that stress is concentrated on the thermoelectric element and the vicinity thereof, even when bending stress is induced in the entire thermoelectric module due to difference in temperature between the exothermic surface and the endothermic surface of the element portion. As a result, it is possible to prevent damage or fracture of the thermoelectric element attributed to stress concentration.

A thermoelectric element according to a second exemplary embodiment of the present invention relates to the thermoelectric element according to the first invention, and wherein the electrodes are respectively formed in a roughly I-shape.

Here, the roughly I-shape is employed as the shape of each electrode for connecting a pair of element portions disposed adjacently to each other.

The middle part of the roughly I-shape is thus narrowed. Therefore, it is possible to inhibit stress concentration on the joint portion between the element portion and each electrode to the minimum extent, while element portions disposed adjacently to each other are electrically connected through the electrode.

A thermoelectric element according to a third exemplary embodiment of the present invention relates to the thermoelectric element according to the first or second exemplary embodiment of the present invention, and wherein the lateral side of each of the electrodes is processed with a surface finishing process for enhancing wettability of the solder.

Accordingly, in joining the first and second surfaces of the element portion and the electrodes, the solder extends with wetting even to the lateral side of each electrode. Thus, each fillet part can be formed in a desired shape.

A thermoelectric element according to a fourth exemplary embodiment of the present invention relates to the thermoelectric element according to the third exemplary embodiment of the present invention, and wherein the surface finishing process is a plating process containing any one selected from the group consisting of Au, Ag, Sn, Rh, Pd, Ni and a solder plating material.

Accordingly, wettability of the solder can be easily enhanced on the lateral side of each electrode.

A thermoelectric element according to a fifth exemplary embodiment of the present invention relates to the thermoelectric element according to any one of the first to fourth exemplary embodiments of the present invention, and wherein the fillet part is formed so as to cover the lateral side of the relevant electrode.

Accordingly, it is possible to more effectively avoid a situation that stress is inevitably concentrated on the thermoelectric element and the vicinity thereof. Thus, it is possible to prevent damage or fracturing of the thermoelectric element attributed to stress concentration.

A thermoelectric module according to a sixth exemplary embodiment of the present invention includes the thermoelectric element according to any one of the first to fifth exemplary embodiments of the present invention and a substrate on which a plurality of the thermoelectric elements are regularly aligned.

Accordingly, it is possible to achieve the aforementioned advantageous effect of enabling prevention of fracture of the thermoelectric element attributed to stress concentration by structuring the thermoelectric module that a plurality of the thermoelectric elements are disposed on the substrate.

A thermoelectric module according to a seventh exemplary embodiment of the present invention relates to the thermoelectric module according to the sixth exemplary embodiment of the present invention, and wherein the thermoelectric elements are disposed at least on an outer side within the module.

Here, in the thermoelectric module structured such that the plural thermoelectric elements are disposed on the substrate, the thermoelectric elements structured as described above are disposed at least on the outer side within the module.

Accordingly, even when bending stress is induced in the entire module due to difference in temperature between the both module surfaces, fracture of the aforementioned thermoelectric elements can be effectively prevented by disposing the thermoelectric elements on the outer side to be most affected by the influence of bending stress induced due to difference in temperature between the both surfaces of the thermoelectric module.

BRIEF DESCRIPTION OF THE DRAWINGS

FIG. 1(a) is a perspective view of a structure of a thermoelectric module including thermoelectric elements according to an exemplary embodiment of the present invention, whereas FIG. 1(b) is an enlarged view of a part X in FIG. 1(a).

FIG. 2(a) is a plan view of an upper substrate and upper electrodes that compose a part of the thermoelectric module in FIG. 1, whereas FIG. 2(b) is a plan view of a lower substrate and lower electrodes that compose a part of the thermoelectric module in FIG. 1.

FIG. 3(a) is a perspective view of a partial structure of the thermoelectric module in FIG. 1 seen from a lateral side, whereas FIG. 3(b) is an enlarged view of a part Y in FIG. 3(a).

FIG. 8(a) is a diagram illustrating a condition that the thermoelectric element is set on a fixture in a stress simulation according to a practical example of the present invention, whereas FIG. 8(b) is a diagram illustrating a stress distribution when distortion is caused in the thermoelectric module.

FIG. 9(a) is a chart representing a stress distribution within an n-type/p-type semiconductor element in a direction B-B' of FIG. 8(b), whereas FIG. 9(b) is a chart representing a stress distribution within the n-type/p-type semiconductor element in a direction C-C' of FIG. 8(b).

FIG. 10(a) is a diagram illustrating a condition that the thermoelectric element is set on the fixture in a stress simulation according to a modification of an exemplary embodiment of the present invention, whereas FIG. 10(b) is a diagram illustrating a stress distribution when distortion is caused in the thermoelectric module.

FIG. 11(a) is a chart representing a stress distribution within the n-type/p-type semiconductor element in a direction B-B' of FIG. 10(b), whereas FIG. 11(b) is a chart representing a stress distribution within the n-type/p-type semiconductor element in a direction C-C' of FIG. 10(b).

FIG. 12(a) is a diagram illustrating a condition that the thermoelectric element is set on the fixture in a stress simulation according to a modification of an exemplary embodiment of the present invention, whereas FIG. 12(b) is a diagram illustrating a stress distribution when distortion is caused in the thermoelectric module.

FIG. 13(a) is a chart representing a stress distribution within the n-type/p-type semiconductor element in a direction B-B' of FIG. 12(b), whereas FIG. 13(b) is a chart representing a stress distribution within the n-type/p-type semiconductor element in a direction C-C' of FIG. 12(b).

FIG. 14(a) is a diagram illustrating a condition that the thermoelectric element is set on the fixture in a stress simulation according to a comparative example of the present invention, whereas FIG. 14(b) is a diagram illustrating a stress distribution when distortion is caused in the thermoelectric module.

FIG. 15(a) is a chart representing a stress distribution within the n-type/p-type semiconductor element in a direction B-B' of FIG. 14(b), whereas FIG. 15(b) is a chart representing a stress distribution within the n-type/p-type semiconductor element in a direction C-C' of FIG. 14(b).

FIG. 16(a) is a diagram illustrating a condition that the thermoelectric element is set on the fixture in a stress simulation according to a comparative example, whereas FIG. 16(b) is a diagram illustrating a stress distribution when distortion is caused in the thermoelectric module.

FIG. 17(a) is a chart representing a stress distribution within the n-type/p-type semiconductor element in a direction B-B' of FIG. 16(b), whereas FIG. 17(b) is a chart representing a stress distribution within the n-type/p-type semiconductor element in a direction C-C' of FIG. 16(b).

DETAILED DESCRIPTION OF EXEMPLARY EMBODIMENTS

Figure 1:
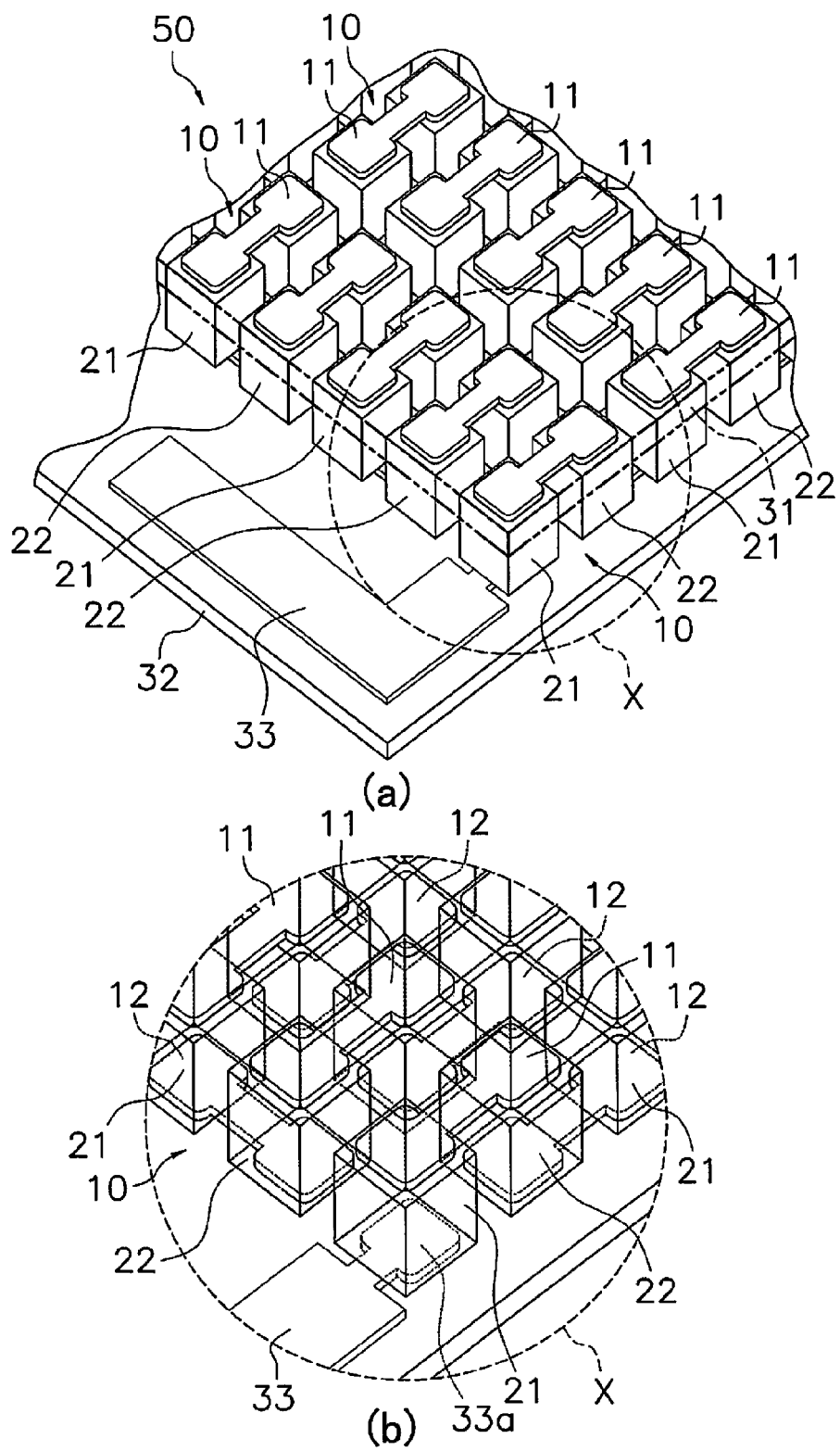
FIG. 1 is composed of FIGS. 1(a) and 1(b)
Figure 2:
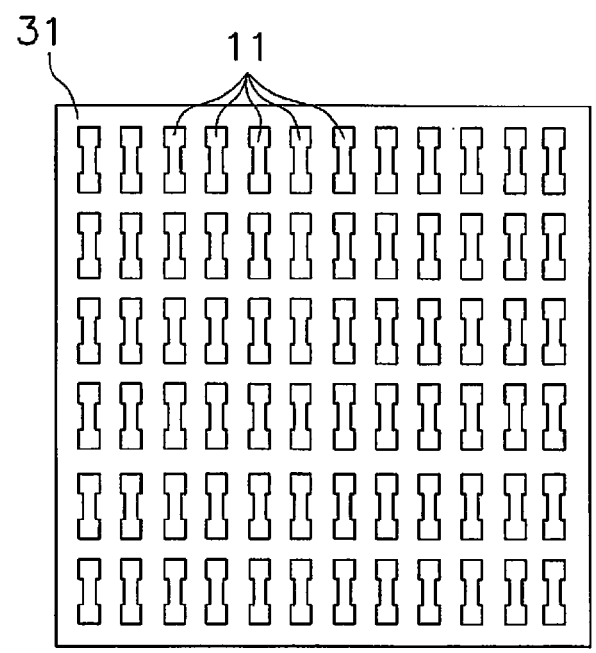
FIG. 2 is composed of FIGS. 2(a) and 2(b)
Figure 2:
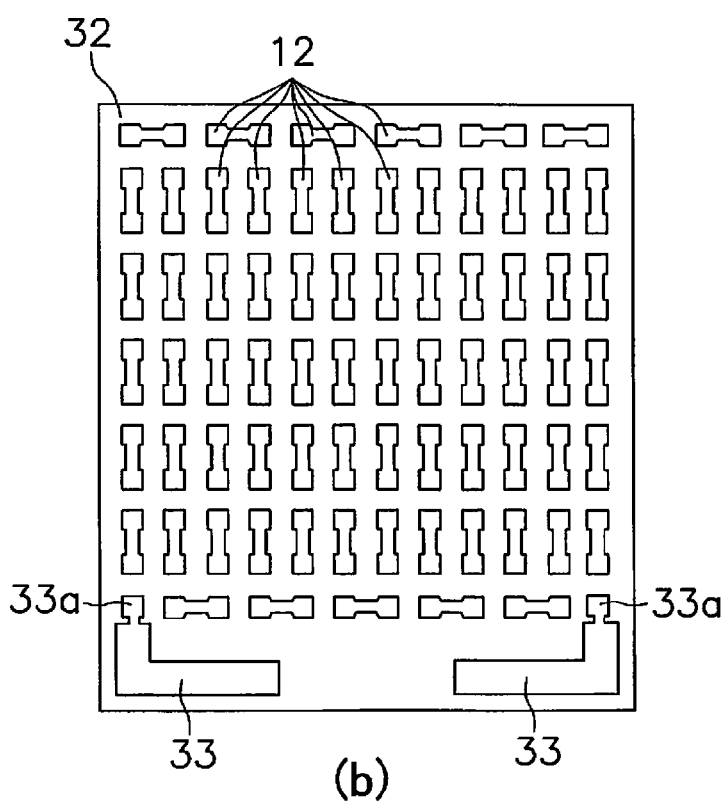
Figure 3:
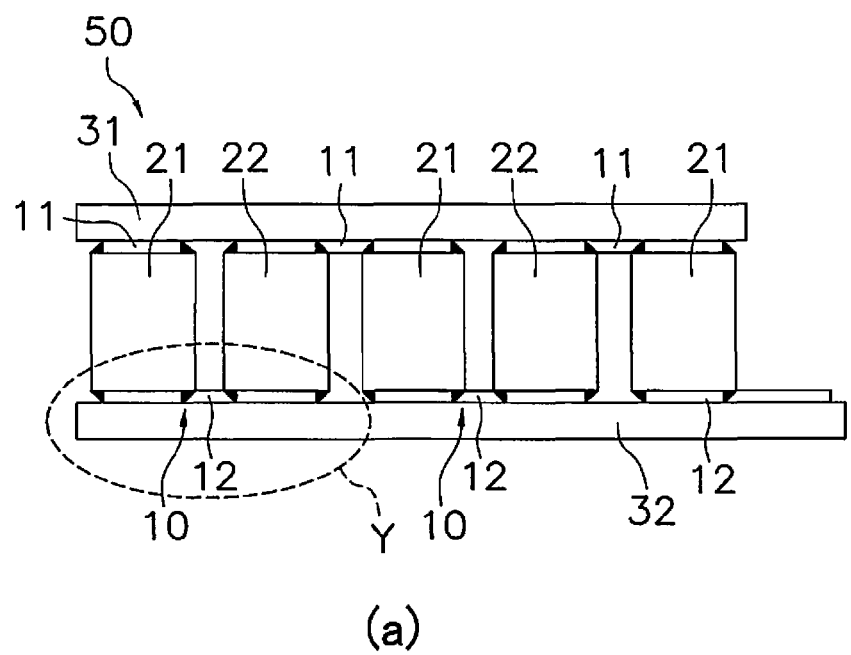
FIG. 3 is composed of FIGS. 3(a) and 3(b)
Figure 3:
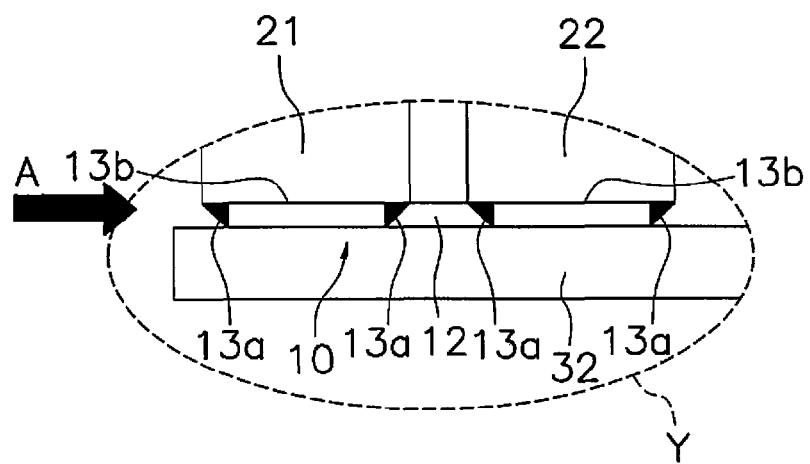

Referring to FIGS. 1(a) to 5, explanation will be hereinafter made for a thermoelectric module 50 including thermoelectric elements 10 according to an exemplary embodiment of the present invention.

Thermoelectric Module 50

The thermoelectric module 50 of the present exemplary embodiment is designed to be embedded, as either a temperature controlling device utilizing the Peltier effect or a power generating device utilizing the Seebeck effect, in a variety of devices. As illustrated in FIG. 1(a), the thermoelectric module 50 is structured such that a plurality of thermoelectric elements 10 are joined to substrates (upper and lower substrates 31 and 32) while being regularly aligned therebetween.

In each thermoelectric element 10, voltage is configured to be applied to an upper and lower pair of electrodes composed of an upper electrode 11 joined to the upper end surfaces (first surfaces) of a roughly cuboid-shaped n-type semiconductor element (element portion) 21 and a roughly cuboid-shaped p-type semiconductor element (element portion) 22, and a lower electrode 12 joined to the lower end surfaces (second surfaces) of the aforementioned (or another) n-type semiconductor element 21 and another (or aforementioned) p-type semiconductor element 22. Accordingly, each thermoelectric element 10 exerts the Peltier effect, for instance, by causing an endothermic phenomenon on the upper end surfaces of the aforementioned n-type and p-type semiconductor elements 21 and 22 and by causing an exothermic phenomenon on the lower end surfaces of the aforementioned n-type and p-type semiconductor elements 21 and 22.

The Peltier effect herein means the following function of a Peltier module. In the π-type thermoelectric element 10 structured by joining a pair of the n-type and p-type semiconductor elements 21 and 22 through the upper electrode 11 made of metal, for instance, when electric current is caused to flow from the n-type semiconductor element 21 to the p-type semiconductor element 22, heat absorption is caused on the upper end surface of the π-type thermoelectric element 10 whereas heat generation is caused on the lower end surface of the π-type thermoelectric element 10.

It should be noted that explanation will be made below in detail for the structure of the plural thermoelectric elements 10 aligned within the thermoelectric module 50.

The upper substrate 31 is a plate-shaped member made of ceramic. As illustrated in FIG. 2(a), the upper substrate 31 has a structure that the plural upper electrodes 11 are formed by means of a plating process to be regularly aligned thereon. It should be noted that the upper electrodes 11 may be formed by soldering Cu plates to a pre-treated ceramic material.

Similarly to the upper substrate 31, the lower substrate 32 is a plate-shaped member made of ceramic. As illustrated in FIG. 2(b), the lower substrate 32 is longer than the upper substrate 31 in one direction, and has a non-overlapping region that does not overlap with the upper substrate 31 in a plan view. Further, similarly to the upper substrate 31, the lower substrate 32 has a structure that the plural lower electrodes 12 are formed by means of a plating process to be regularly aligned in a region opposed to the upper substrate 31. Further, power supply electrodes 33 to be connected to lead wires are mounted to the aforementioned non-overlapping region of the lower substrate 32. It should be noted that the size relation between the upper and lower substrates 31 and 32 is not limited to that described above.

It should be noted that a heat exchange substrate, formed by an insulating substrate made of alumina ($Al_2O_3$), aluminum nitride (AlN), silicon nitride ($Si_3N_4$) or so forth, can be used as a material of which the upper substrate 31 and the lower substrate 32 are made.

The power supply electrodes 33 are provided for applying voltage to the lower electrodes 12 from the outside, and are obtained by performing a variety of plating processes onto Cu electrodes similarly to the upper and lower electrodes 11 and 12 to be described below in detail.

Thermoelectric Element 10

As illustrated in FIGS. 3(a) and 3(b), each thermoelectric element 10 includes the semiconductor elements (the n-type semiconductor element 21 and the p-type semiconductor element 22), the upper electrode 11, the lower electrode 12 and joint portions 13.

Semiconductor Element

In the present exemplary embodiment, the semiconductor elements included in the thermoelectric element 10 are composed of a pair of the n-type semiconductor element 21 and the p-type semiconductor element 22. Further, the upper end surfaces or the lower end surfaces of the pair of the n-type and p-type semiconductor elements 21 and 22 are joined to each other through the upper electrode 11 or the lower electrode 12.

Each n-type/p-type semiconductor element 21, 22 is made of a material containing $Bi_2Te_3$ as a base material and other chemical compounds. In general, the Young's modulus of $Bi_2Te_3$ is less than that of metal and that of ceramic, and the fracture strength of $Bi_2Te_3$ is also less than that of metal and that of ceramic. Thus, $Bi_2Te_3$ is vulnerable.

Where a pair of the n-type and p-type semiconductor elements 21 and 22 is joined through the upper electrode 11, for instance, when voltage is applied to the lower electrode 12 joined to the lower end surface of the n-type semiconductor element 22 and accordingly electric current flows in an N-to-P direction, the Peltier effect is exerted such that heat absorption is caused on the top-face side of the π-type thermoelectric element 10 whereas heat generation is caused on the bottom-face side of the π-type thermoelectric element 10. Accordingly, the entire thermoelectric module 50 is enabled to have functions of heat absorption and heat generation.

Further, each n-type/p-type semiconductor element 21, 22 is formed in a roughly cuboid shape, and the upper electrode 11 is joined to the upper end surface thereof while the lower electrode 12 is joined to the lower end surface thereof.

It should be noted that as illustrated in FIG. 3(a), the n-type semiconductor elements 21 and the p-type semiconductor elements 22, composing the thermoelectric module 50, are structured by repetition of the following configuration that a pair of a given n-type semiconductor element 21 and a given p-type semiconductor element 22 is coupled in a π-type through a given upper electrode 11 in one direction that the given n-type and p-type semiconductor elements 21 and 22 are aligned adjacently to each other, subsequently, a pair of the given p-type semiconductor element 22 and another n-type semiconductor element 21, aligned adjacently to each other in the aforementioned direction, is coupled in a reverse π-type through a given lower electrode 12; yet subsequently, a pair of aforementioned another n-type semiconductor element 21 and another p-type semiconductor element 22, aligned adjacently to each other in the aforementioned direction, is coupled in the π-type through another upper electrode 11.

Upper and Lower Electrodes 11 and 12

The upper electrodes 11 and the lower electrodes 12 are provided as electrodes made of Cu, and as illustrated in FIGS. 2(a) and 2(b), the upper electrodes 11 are regularly aligned on the upper substrate 31 whereas the lower electrodes 12 are regularly aligned on the lower substrate 32. Further, each upper electrode 11 is joined to the upper end surfaces of one pair of the n-type and p-type semiconductor elements 21 and 22 through the joint portions 13 to electrically connect the upper end surfaces of the pair, whereas each lower electrode 12 is joined to the lower end surfaces of one pair of the n-type and p-type semiconductor elements 21 and 22 through the joint portions 13 to electrically connect the lower end surfaces of the pair.

Figure 4:
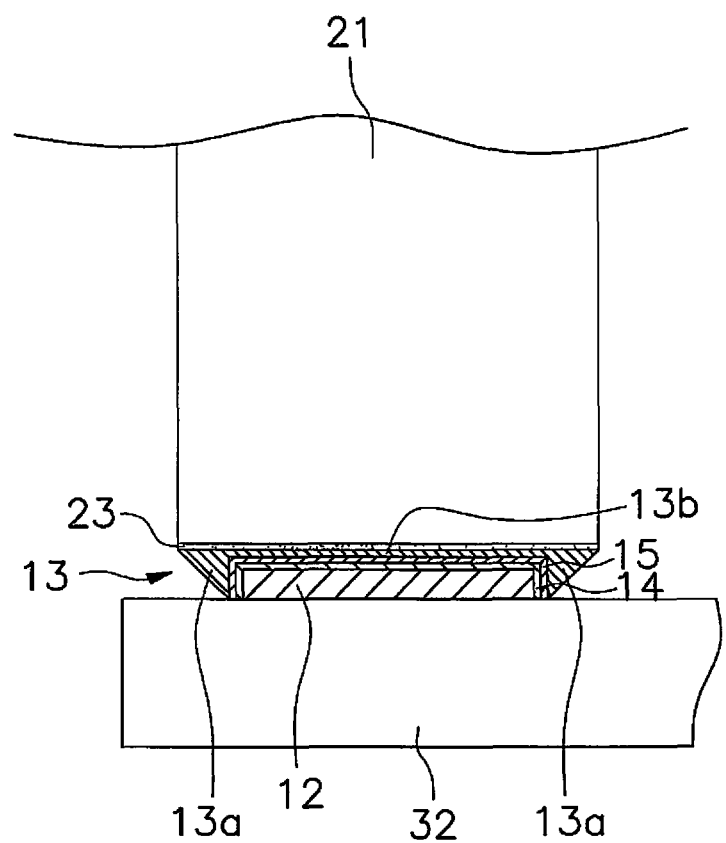
FIG. 4 is an enlarged view of a structure of a joint region between an n-type semiconductor element and the lower electrode in FIG. 3(b) seen from a direction A.

Using FIG. 4, explanation will be herein made for a detailed structure of a joint region between each upper/lower electrode 11, 12 and the upper/lower end surface of each n-type/p-type semiconductor element 21, 22 and the vicinity of the joint region.

It should be noted that, for convenience of explanation, FIG. 4 illustrates an enlarged view of a joint region between the lower electrode 12 joined onto the lower substrate 32 and the lower end surface of the n-type semiconductor element 21. However, a joint region between the upper electrode 11 joined onto the upper substrate 31 and the upper end surface of the n-type semiconductor element 21 is designed to be structured similarly to the aforementioned joint region. Further, a joint region between the lower end surface of the p-type semiconductor element 22 and the lower electrode 12 and a joint region between the upper end surface of the p-type semiconductor element 22 and the upper electrode 11 are also designed to be structured similarly to the joint region between the lower end surface of the n-type semiconductor element 21 and the lower electrode 12 illustrated in FIG. 4.

As illustrated in FIG. 4, each lower electrode 12 is directly formed on the lower substrate 32, and has an Ni plated layer 14 and an Au plated layer 15 on its lateral sides and its face opposed to the lower end surface of the n-type semiconductor element 21. Further, each lower electrode 12 is joined to the lower end surface of the n-type semiconductor element 21 through the Ni plated layer 14, the Au plated layer 15 and a barrier layer 23 applied to the lower end surface of the n-type semiconductor element 21.

Here, the aforementioned Ni plated layer 14 and Au plated layer 15 are formed by means of an electrode surface finishing process performed for the upper and lower electrodes 11 and 12 to enhance wettability of solder in forming the joint portion 13 to be described. It should be noted that solder has been preliminarily formed on the lower end surface of the n-type semiconductor element 21 by means of a method of plating, welding or so forth, and thus, wettability has been reliably achieved.

Figure 5:
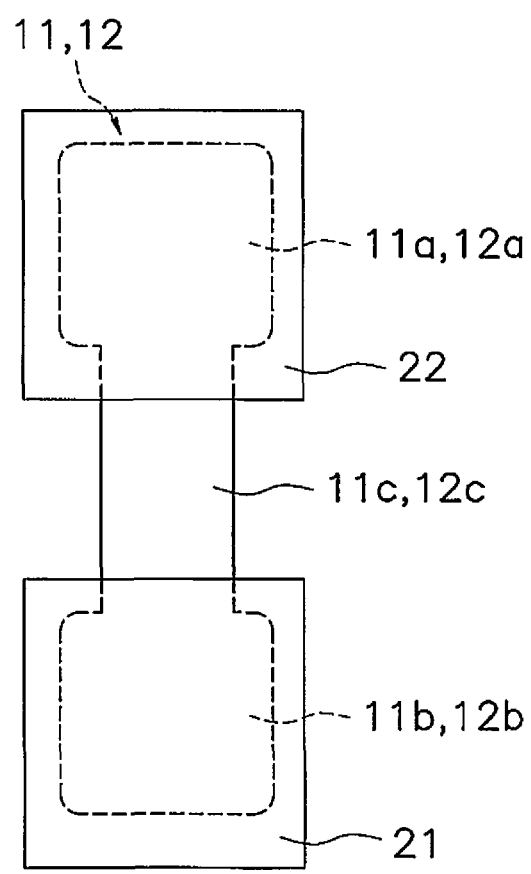
FIG. 5 is an enlarged plan view of a structure of the lower electrode and the vicinity thereof in FIG. 4.

Further, as illustrated in FIG. 5, lower electrode 12 is formed in a roughly I-shape in a plan view, and is composed of electrode parts 12a and 12b and a coupling part 12c.

It should be noted that, for convenience of explanation, explanation will be herein made for the structure of the lower electrode 12. However, as illustrated in FIG. 5, the upper and lower electrodes 11 and 12 are designed to be formed in the same shape.

As illustrated in FIG. 5, the lower electrode 12 has the electrode parts 12a and 12b and the coupling part 12c.

In a plan view, the electrode parts 12a and 12b form thick parts disposed on the both ends of the roughly I-shape. Further, the electrode parts 12a and 12b are joined to the upper end surfaces and the lower end surfaces of the n-type and p-type semiconductor elements 21 and 22 through the joint portions 13.

Further, in a plan view as illustrated in FIG. 5, while being embedded in the thermoelectric element 10, each electrode part 12a, 12b is formed to have an area less than that of the end surface of the relevant p-type/n-type semiconductor element 22, 21. In a plan view, each electrode part 12a, 12b is entirely covered with the end surface of the relevant p-type/n-type semiconductor element 22, 21, while the end surfaces of the relevant p-type/n-type semiconductor element 22, 21 protrude from the electrode part 12a, 12b in four directions except for the part overlapping with the coupling part 12c.

The coupling part 12c is disposed between the electrode parts 12a and 12b disposed on the both ends of the roughly I-shape, and forms a thin part of the roughly I-shape in a plan view. In other words, the coupling part 12c is formed with a width less than that of each electrode part 12a, 12b in a plan view of the roughly I-shaped lower electrode 12. Further, as illustrated in FIGS. 1(b) and 5, while being embedded in the thermoelectric element 10, the coupling part 12c is mounted such that the most part thereof does not make contact with the upper/lower end surfaces of the n-type and p-type semiconductor elements 21 and 22.

Joint Portion 13

Next, using FIGS. 3(b) and 4, explanation will be hereinafter made for the structure of each joint portion 13 for joining the upper/lower electrode 11, 12 and the upper/lower end surface of the n-type/p-type semiconductor element 21, 22.

It should be noted that, for convenience of explanation, FIG. 3(b) illustrates a joint region between the lower electrode 12 and the lower end surface of the n-type/p-type semiconductor element 21, 22. However, a joint region between the upper electrode 11 and the upper end surface of the n-type/p-type semiconductor element 21, 22 is also designed to be structured similarly to the joint region to be described. Further, for convenience of explanation, FIG. 4 illustrates a joint region between the lower electrode 12 and the lower end surface of the n-type semiconductor element 21. However, a joint region between the lower electrode 12 and the lower end surface of the p-type semiconductor element 22 and a joint region between the upper electrode 11 and the upper end surface of the n-type/p-type semiconductor element 21, 22 are also designed to be structured similarly to the joint region to be described.

As illustrated in FIG. 3(b), the joint portions 13 are formed by solder in joining the lower end surfaces of the n-type and p-type semiconductor elements 21 and 22 and the electrode parts 12a and 12b that are parts of the lower electrode 12 respectively having a smaller area than the relevant end surface. Further, as illustrated in FIG. 4, each joint portion 13 has a fillet part 13a and a surface joint part 13b. The fillet part 13a is formed by solder to fill a space between intersecting surfaces composed of each lateral side of the lower electrode 12, and a part of the lower end surface of the n-type semiconductor element 21 that forms a step outwardly extending from each lateral side of the lower electrode 12. The surface joint part 13b is formed as a solder layer in a position interposed between the lower end surface of the n-type semiconductor element 21 and the opposed face of the lower electrode 12 to the lower end surface.

When the lower end surface of the n-type/p-type semiconductor element 21, 22 and the face of the lower electrode 12 are joined, surplus solder goes beyond the joint region and spreads with wetting toward each lateral side of the lower electrode 12. Thus, as illustrated in FIGS. 3(b) and 4, the fillet part 13a is formed between intersecting surfaces composed of each lateral side of the lower electrode 12, and an outer part of the lower end surface of the n-type/p-type semiconductor element 21, 22 that forms the aforementioned step and that the lower electrode 12 is not joined thereto. The fillet part 13a is formed by solder that spreads with wetting in the space between each lateral side of the lower electrode 12 and the lower end surface of the n-type/p-type semiconductor element 21, 22 to be formed in a roughly triangular shape in a cross-sectional view. Therefore, each fillet part 13a is formed to enclose the lateral sides of each electrode part 12a, 12b of the lower electrode 12. It should be noted that the fillet part 13a may be formed in an arc-like shape in a cross-sectional view. A certain volume of surplus solder is allowable depending on the extent of bulging of the fillet part 13a.

In the present exemplary embodiment, the lateral sides of the upper/lower electrode 11, 12 have been processed with a surface finishing process for enhancing wettability of solder such that surplus solder can spread with wetting in a desired shape when the lower end surface of the n-type/p-type semiconductor element 21, 22 and the face of the lower electrode 12 in a manufacturing step of the thermoelectric module 50. Specifically, as described above, the Ni plated layer 14 and the Au plated layer 15 are formed on the lateral sides of the upper/lower electrode 11, 12, and thereby, the wettability of solder is enhanced.

Accordingly, it is possible to avoid a situation that solder, going beyond the joint region in joining the face of the lower electrode 12 and the lower end surface of the n-type/p-type semiconductor element 21, 22, is inevitably formed in a shape (e.g., a shape with an edge or a mound shape) that makes stress likely to concentrate on the element portion.

The surface joint part 13b is formed by solder remained without going beyond the joint region in joining the face of the lower electrode 12 and the lower end surface of the n-type/p-type semiconductor element 21, 22.

In the thermoelectric element 10 and the thermoelectric module 50 provided with the same according to the present exemplary embodiment, with the structure as described above, the aforementioned shape of the joint portion 13 (the fillet part 13a) enables stress dispersion to the lower substrate 32 without causing stress concentration on the n-type/p-type semiconductor element 21, 22 and the vicinity thereof, even when bending stress is induced in the entire thermoelectric module 50 due to difference in temperature between the endothermic-side surface and the exothermic-side surface in applying voltage to the thermoelectric module 50.

Accordingly, it is possible to avoid stress concentration on the n-type/p-type semiconductor element 21, 22 and the vicinity thereof, and to prevent fracture of the n-type/p-type semiconductor element 21, 22.

Advantageous effects of the present invention will be hereinafter verified based on practical examples, comparative examples and so forth.

Practical Example 1

Explanation will be herein made for a result of a durability test conducted for the thermoelectric module 50 according to the aforementioned exemplary embodiment.

Figure 6:
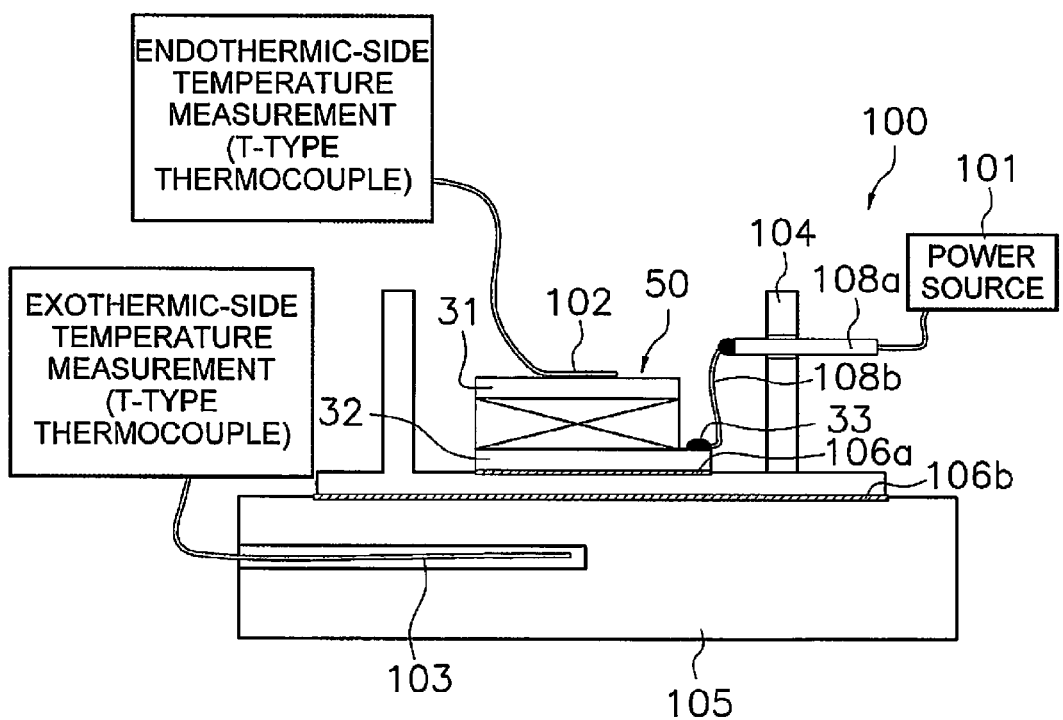
FIG. 6 is a diagram illustrating a structure of a test device for conducting a duration test of the thermoelectric module of an exemplary embodiment of the present invention.
Figure 7:
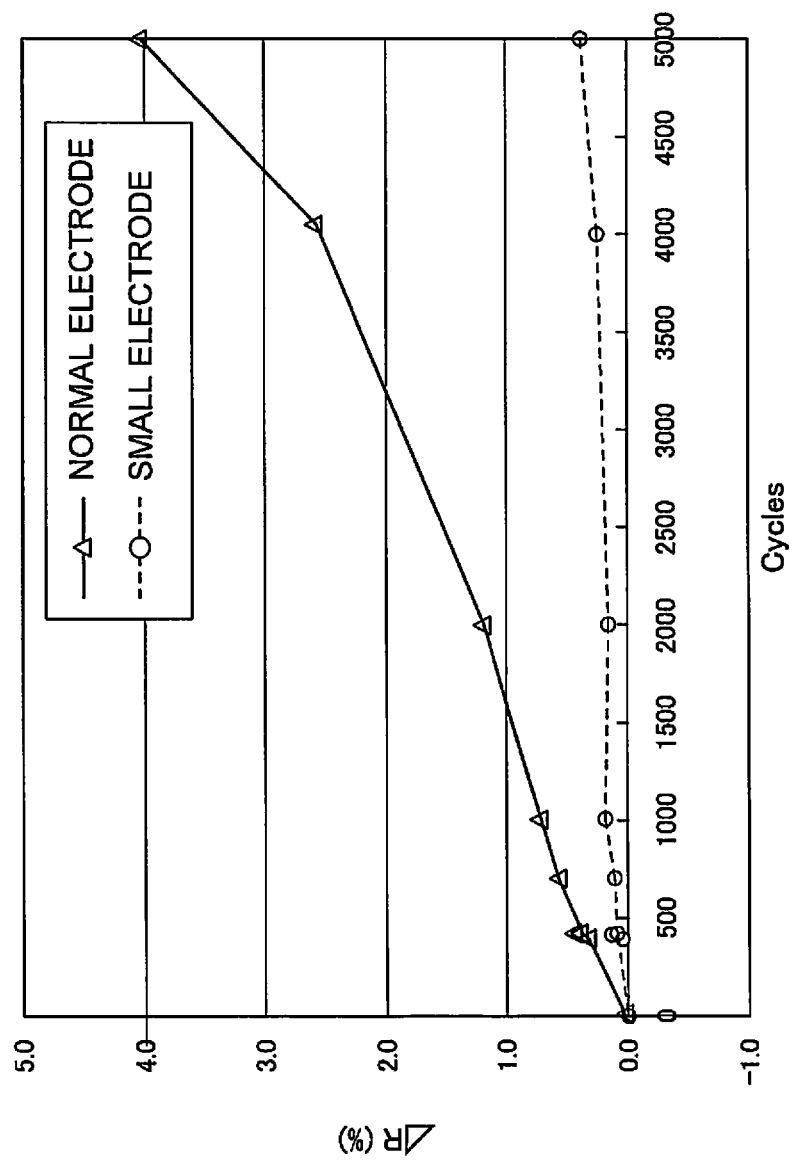
FIG. 7 is a chart representing a result of the test conducted by the test device in FIG. 6.
Figure 8:
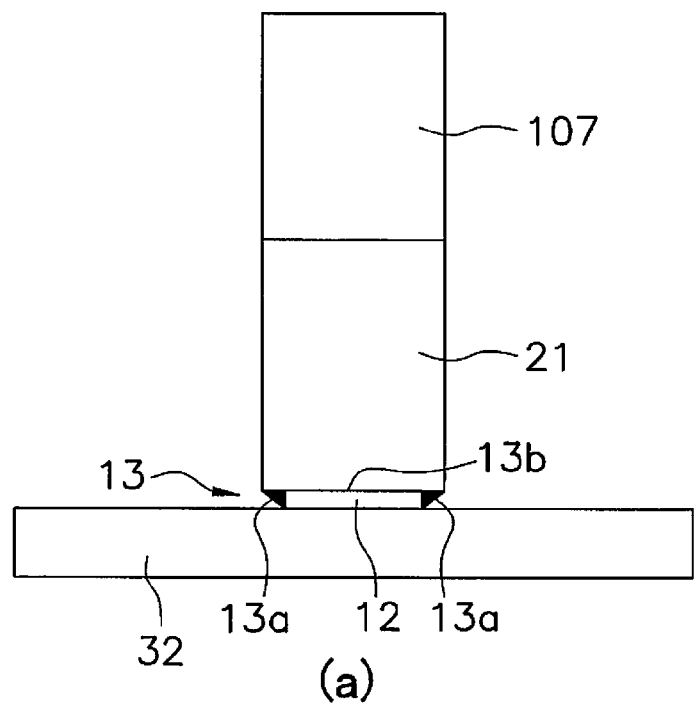
FIG. 8 is composed of FIGS. 8(a) and 8(b)
Figure 8:
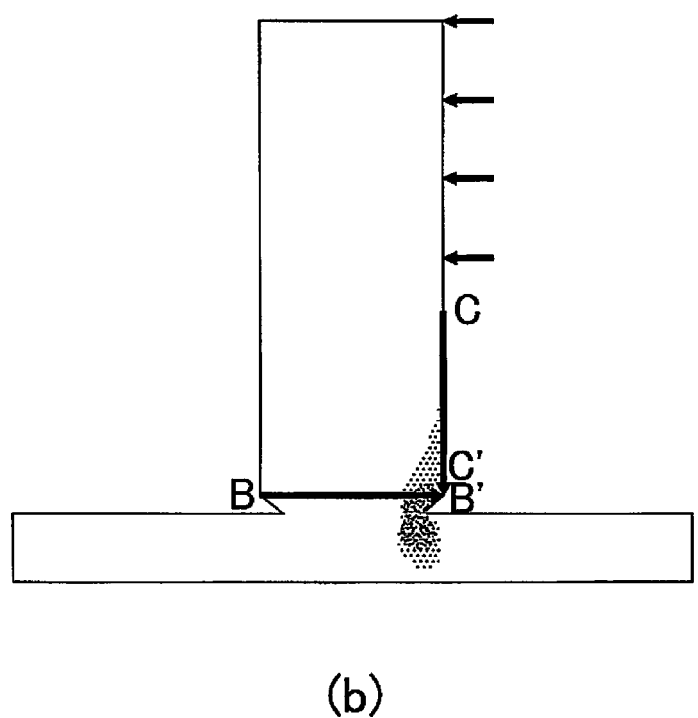
Figure 9:
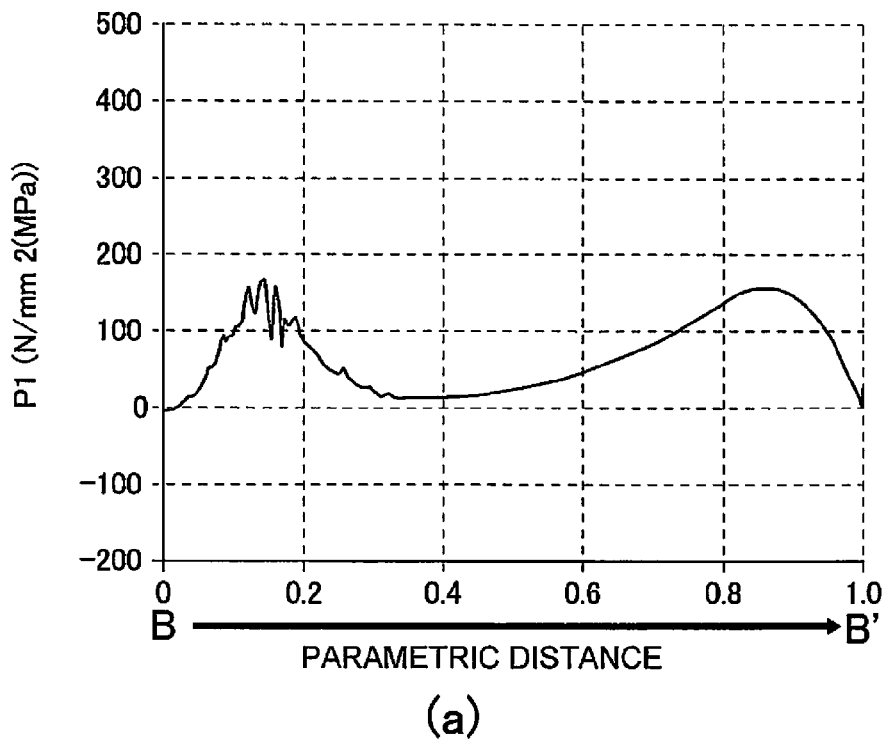
FIG. 9 is composed of FIGS. 9(a) and 9(b)
Figure 9:
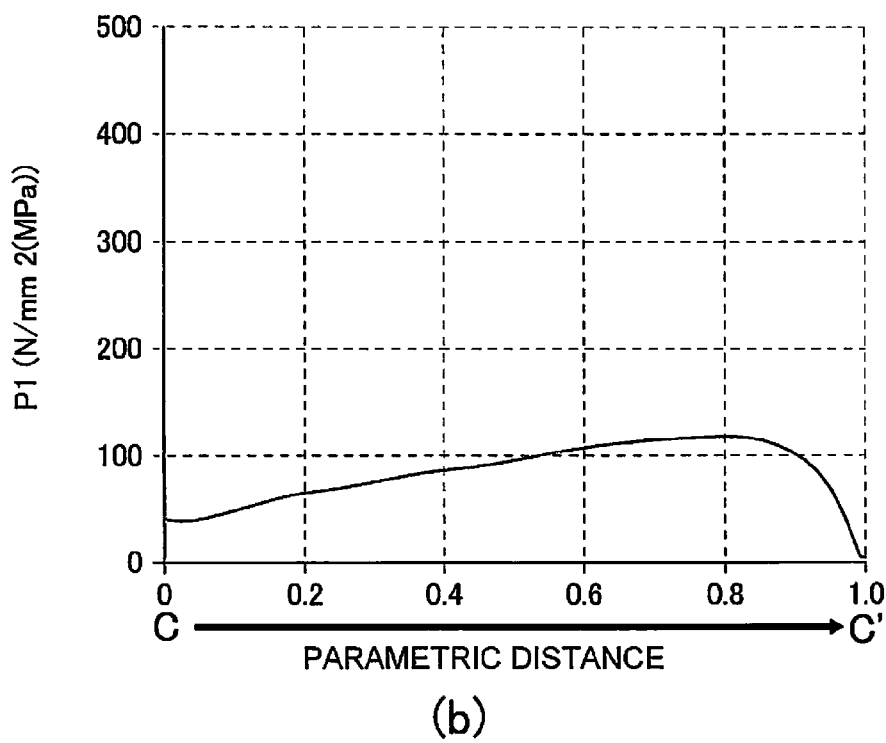
Figure 10:
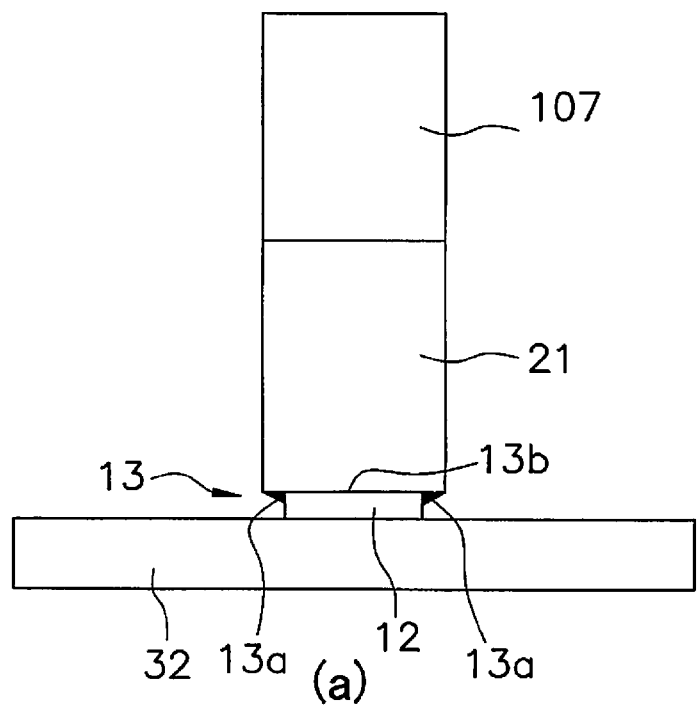
FIG. 10 is composed of FIGS. 10(a) and 10(b)
Figure 10:
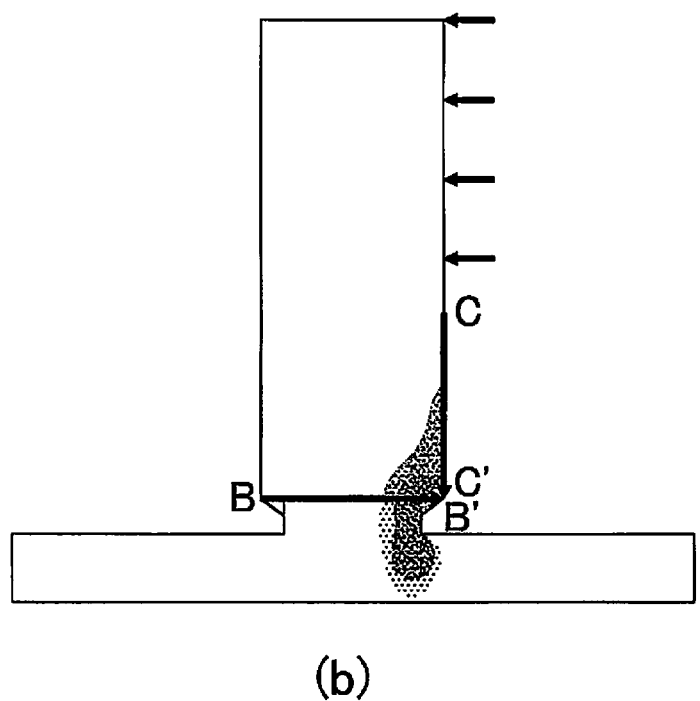
Figure 11:
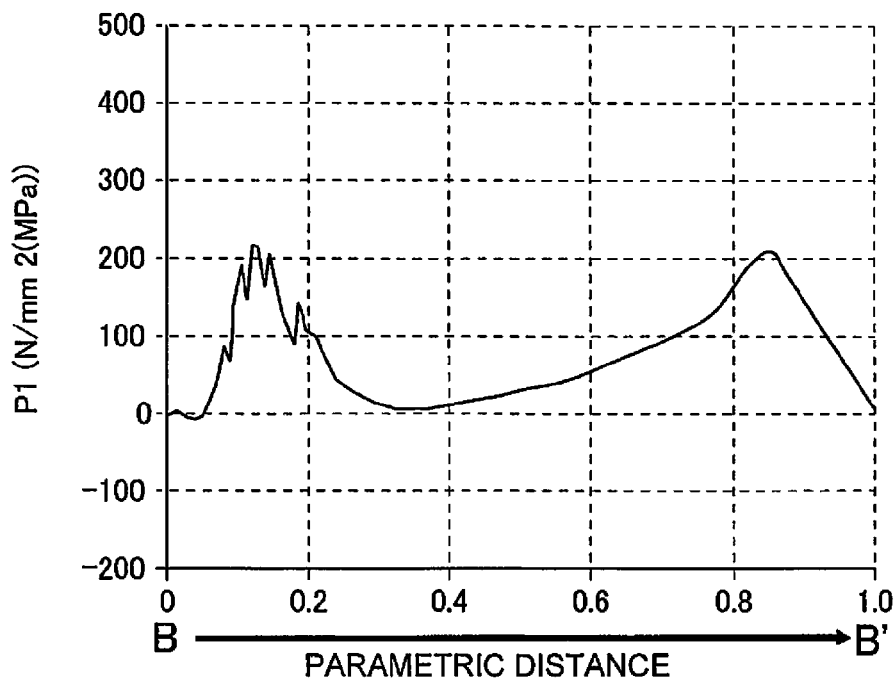
FIG. 11 is composed of FIGS. 11(a) and 11(b)
Figure 11:
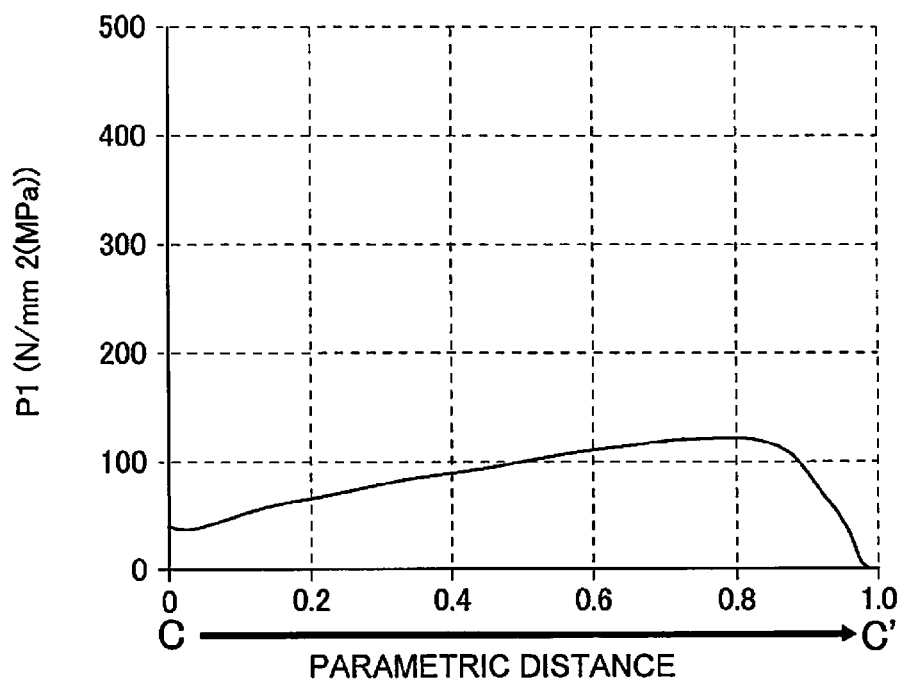

Using FIGS. 6 and 7, explanation will be specifically made for a result of a durability test conducted to detect a rate of change in resistance of the entire thermoelectric module 50 at predetermined cycles by repeatedly performing a step of applying voltage to the thermoelectric module 50 through the practical supply of power to the thermoelectric module 50 with use of a test device 100 to cause difference in temperature within the thermoelectric module 50.

As illustrated in FIG. 6, the test device 100 includes a power source 101, T-type thermocouples 102 and 103, a 14-pin butterfly package 104, a heat plate 105, a solder joint portion 106a and a grease layer 106b.

The thermoelectric module 50 is fixed to the inside of the 14-pin butterfly package 104 through the solder joint portion 106a.

Power is supplied to the thermoelectric module 50 from the power source 101 via a terminal 108a and a lead wire 18b of the 14-pin butterfly package 104. Thus, difference in temperature is caused between the top face and the bottom face of the thermoelectric module 50.

The power source 101 is configured to repeatedly turn on and off a predetermined voltage with respect to the aforementioned lead wire 108b of the thermoelectric module 50 to repeatedly cause difference in temperature.

To measure temperatures of the top and bottom faces of the thermoelectric module 50, the T-type thermocouple 102 is mounted to the top face of the upper substrate 31 of the thermoelectric module 50, whereas the T-type thermocouple 103 is mounted within the heat plate 105 disposed on the bottom-face side of the lower substrate 32 of the thermoelectric module 50.

The heat plate 105 is a plate-shape member made of Cu, and the 14-pin butterfly package 104 is mounted to the heat plate 105 through the grease layer 106b.

In the present practical example, a test of repeatedly turning on and off electric current with a current value Imax was conducted with use of a module having the following specifications including Imax=3.1 A, an upper substrate size of 15 mm×15 mm, a lower substrate size of 15 mm×17 mm, 72 pairs, and solder made of Sn95Sb5 for joining semiconductor elements and electrodes.

The test conditions were set as follows.
Heat plate: Th=85° C.
Endothermic surface: Tc=−5° C.

Atmosphere: ambient condition
Package material: Cu20W80
Solder for joining package and module: BiSn
Normal electrode module
Endothermic-side substrate: AlN
Exothermic-side substrate: AlN
Small electrode module
Endothermic-side substrate: AlN
Exothermic-side substrate: AlN FIG. 7 represents results of durability tests conducted with use of the aforementioned test device 100 with respect to a thermoelectric module (small electrodes) according to exemplary embodiments of the present invention and a well-known thermoelectric module (normal electrodes) that each electrode has an area greater than that of its relevant semiconductor element on a contact plane between each electrode and its relevant semiconductor element.

It should be noted that in the chart represented in FIG. 7, the horizontal axis indicates frequency of repetition (cycles), whereas the vertical axis indicates a rate of change in resistance (ΔR (%)) between leads of the thermoelectric module 50.

Here, the rate of change in resistance (ΔR (%)) is defined as follows.

$$\Delta R(\%) = (R2 - R1)/R1 \times 100(\%)$$

R1: a pre-test (0 cycle) resistance value
R2: a post-test resistance value

FIG. 7 represents the results of the durability tests conducted with use of the aforementioned test device 100 with respect to the thermoelectric module (small electrodes) according to an exemplary embodiment of the present invention and the well-known thermoelectric module (normal electrodes) that each electrode has an area greater than that of its relevant semiconductor element on the joint plane between each electrode and its relevant semiconductor element.

It should be noted that in the chart of FIG. 7, the vertical axis indicates the rate of change in resistance (ΔR (%)), whereas the horizontal axis indicates the frequency of repetition (cycles).

As is obvious from the chart of FIG. 7, it is understood that in the chart, the gradient of a line corresponding to the test result for the thermoelectric module (small electrodes) of the present invention is more gentle than that corresponding to the test result for the well-known thermoelectric module (normal electrodes).

It was found that the rate of change in resistance can be further inhibited from increasing in the structure of the thermoelectric module of an exemplary embodiment of the present invention in comparison with the well-known thermoelectric module even when the condition is repeatedly produced that difference in temperature is caused between the top face and the bottom face of the thermoelectric module.

Here, when the rate of change in resistance is low in the entire thermoelectric module, this means that cracking is inhibited from occurring and developing in a direction of blocking electric conduction in the p-type/n-type semiconductor element when the durability test is conducted at every predetermined cycle, and therefore, such cracking hardly affects the electric characteristic of the thermoelectric module 50. By contrast, when the rate of change in resistance is high in the entire thermoelectric module, this means that stress, exceeding the bending strength of the p-type/n-type semiconductor element, has been induced in the p-type/n-type semiconductor element at every predetermined cycle, thereby, transverse cracking has inevitably occurred. Consequently, the electric characteristic of the thermoelectric module has been degraded, and thus, the value of resistance with respect to the applied voltage has been gradually increased.

Based on the above, it is deducted as a conclusion that fracture of the thermoelectric elements occurred in the durability test conducted for the well-known thermoelectric module using the normal electrodes. Additionally, it is deducted as a conclusion that occurrence of fracture of the p-type/n-type semiconductor element was successfully inhibited in the durability test similarly conducted for the thermoelectric module according to an exemplary embodiment of the present invention.

Practical Example 2

Next, using FIGS. 8(a) to 9(b), explanation will be made for a result of simulation for verifying a stress distribution within an element portion in, and in the vicinity of, a joint region between an electrode and a thermoelectric element, where the thermoelectric element (the n-type semiconductor element 21), included in a thermoelectric module structured similarly to that of the aforementioned exemplary embodiment, is joined together with the electrode (the lower electrode 12) to a substrate (the lower substrate 32), and under the condition, a fixture 107 is further joined to the upper end surface of the thermoelectric element.

Specifically, the condition of the thermoelectric module according to the present practical example was produced through a manufacturing step in which an appropriate amount of solder has leaked and spread with wetting to cover the entire lateral sides of the lower electrode 12 and thus the preferable fillet part 13a has been formed.

FIG. 8(a) illustrates a condition that the n-type semiconductor element 21 and the lower electrode 12 are joined, as a part of the thermoelectric element according to an exemplary embodiment of the present invention, onto the lower substrate 32 through the joint portion 13 made of solder, and further, the fixture 107 is fixed to the upper end surface of the thermoelectric element.

A structure of FIG. 8(b) corresponds to that of FIG. 8(a), and illustrates a distribution of stress to be induced when a predetermined pressing force is applied in an arrow direction to replicate a condition that bending stress is induced in the entire thermoelectric module in a simulated manner. As illustrated in FIG. 8(b), it is understood that focusing on, and on the vicinity of, the joint region between the lower electrode 12 and the lower end surface of the n-type semiconductor element 21, large stress is induced in positions closer to the substrate 32 rather than in the n-type semiconductor element 21 and the vicinity thereof. The content of the present exemplary embodiment relates to the n-type semiconductor element, but is also basically true of the p-type semiconductor element.

Thus, according to the structure of the present invention, even when bending stress is induced in the entire module due to difference in temperature between the top face and the bottom face of the thermoelectric module, it is possible to cause bending stress to be induced in the substrate 32 and the electrode 12, each of which has high Young's modulus and high fracture strength, while stress concentration on the n-type semiconductor element 21 can be avoided. Consequently, it was found that fracture of the thermoelectric element can be inhibited and durability of the thermoelectric module can be enhanced.

Next, FIG. 9(a) is a chart representing a stress distribution in a direction B-B' in the stress distribution diagram of FIG. 8(b). Specifically in FIG. 9(a), the horizontal axis indicates a parametric distance from a point B to a point B' in FIG. 8(b), whereas the vertical axis indicates the magnitude of stress. It should be hereinafter noted that the value of stress is a simulation value and is not intended to indicate stress in reality. The value of stress is calculated for confirming relative differences among the respective practical examples and the respective comparative examples.

FIG. 9(b) is a chart representing a stress distribution in a direction C-C' in the stress distribution diagram of FIG. 8(b). Specifically in FIG. 9(b), the horizontal axis indicates a parametric distance from a point C to a point C' in FIG. 8(b), whereas the vertical axis indicates the magnitude of stress.

As is obvious from the chart of FIG. 9(a), somewhat highly stressed parts exist in the both end parts of the n-type semiconductor element 21 in the direction B-B' corresponding to the width direction of the n-type semiconductor element 21.

On the other hand, as is obvious from the chart of FIG. 9(b), the stress distribution gently varies in the direction C-C' corresponding to the vertical direction of the n-type semiconductor element 21. It should be noted that the content of the present practical example relates to the n-type semiconductor element, but is also basically true of the p-type semiconductor element.

Based on the above, it was found that in the thermoelectric element according to the present practical example, no stress concentrated part exists in the thermoelectric element and the vicinity thereof. As a result, according to the structure of the present practical example, no stress concentrated part exists in the thermoelectric element and the vicinity thereof even when bending stress is induced in the thermoelectric module. Hence, it is possible to prevent fracture of the element attributed to stress concentration.

Practical Example 3

Next, using FIGS. 10(a) to 11(b), explanation will be made for a result of simulation for verifying a stress distribution in, and in the vicinity of, a joint region between an electrode and a thermoelectric element, where the thermoelectric element (the n-type semiconductor element 21), included in a thermoelectric module according to a modification of the present invention, is joined together with the electrode (the lower electrode 12) to a substrate (the lower substrate 32), and under the condition, the fixture 107 is further joined to the upper end surface of the thermoelectric element.

It should be noted that the thermoelectric module according to the present practical example is different from that of the aforementioned practical example 2 in that a sufficient amount of solder has not leaked with respect to the size of each lateral side of the electrode 12 in the manufacturing step, and therefore, the fillet part 13a is formed only on the upper end part of each lateral side of the electrode 12.

FIG. 10(a) illustrates a condition that the n-type semiconductor element 21 and the lower electrode 12 are joined, as a part of the thermoelectric element according to the present invention, onto the lower substrate 32 through the joint portion 13 made of solder, and further, the fixture 107 is fixed to the upper end surface of the thermoelectric element.

A structure of FIG. 10(b) corresponds to that of FIG. 10(a), and illustrates a distribution of stress to be induced when a predetermined pressing forte is applied in an arrow direction to replicate a condition that bending stress is induced in the entire thermoelectric module in a simulated manner. As illustrated in FIG. 10(b), it is understood that focusing on, and on the vicinity of, the joint region between the lower electrode 12 and the lower end surface of the n-type semiconductor element 21, large stress is induced in the lateral side of the lower electrode 12 and positions closer to the substrate 32 rather than in the n-type semiconductor element 21 and the vicinity thereof.

Thus, according to the structure of the present invention, it was found that, even when bending stress is induced in the entire module due to difference in temperature between the top face and the bottom face of the thermoelectric module, stress concentration on the n-type semiconductor element 21 can be avoided although stress is not sufficiently reduced, and thus, fracture of the thermoelectric element can be inhibited.

Next, FIG. 11(a) is a chart representing a stress distribution in a direction B-B' in the stress distribution diagram of FIG. 10(b). Specifically in FIG. 11(a), the horizontal axis indicates a parametric distance from a point B to a point B' in FIG. 10(b), whereas the vertical axis indicates the magnitude of stress.

FIG. 11(b) is a chart representing a stress distribution in a direction C-C' in the stress distribution diagram of FIG. 10(b). Specifically in FIG. 11(b), the horizontal axis indicates a parametric distance from a point C to a point C' in FIG. 10(b), whereas the vertical axis indicates the magnitude of stress.

As is obvious from the chart of FIG. 11(a), somewhat highly stressed parts exist in the both end parts of the n-type semiconductor element 21 in the direction B-B' corresponding to the width direction of the n-type semiconductor element 21.

On the other hand, as is obvious from the chart of FIG. 11(b), the stress distribution gently varies in the direction C-C' corresponding to the vertical direction of the n-type semiconductor element 21.

Based on the above, it was found that in the thermoelectric element according to the present practical example, no stress concentrated part exists in the thermoelectric element and the vicinity thereof. As a result, according to the structure of the present practical example, no stress concentrated part exists in the thermoelectric element and the vicinity thereof even when bending stress is induced in the thermoelectric module. Hence, it is possible to prevent fracture of the element attributed to stress concentration.

Now, explanation will be hereinafter made for a result of weighing the structure of the present practical example (see FIGS. 10(a) and 10(b)) and the aforementioned structure of the practical example 2 (see FIGS. 8(a) and 8(b)).

As represented in the charts of FIGS. 9(a) and 9(b) and those of FIGS. 11(a) and 11(b), it was found that stress concentration, caused on a part of the semiconductor element, could be avoided in both of the structures of the practical examples 2 and 3.

It should be noted that the magnitude of stress induced in a part of the semiconductor element was less in the structure of the practical example 2 than in that of the practical example 3.

A reason of the above can be assumed as follows. The origin of stress occurrence corresponds to the tip end of the fillet part and the lateral sides of the electrode, thereby distance from the origin of stress occurrence to the semiconductor element is greater in the structure of the practical example 2 than in that of the practical example 3. Consequently, stress induced in the structure of the practical example 2 became less than that induced in the structure of the practical example 3.

It should be noted that in consideration of the fact that solder does not spread with wetting on the substrate, it is assumed to be difficult to achieve an advantageous effect of reducing stress equivalent to or better than that achieved by the structure of the practical example 2.

Practical Example 4

Next, using FIGS. 12(a) to 13(b), explanation will be made for a result of simulation for verifying a stress distribution in, and in the vicinity of, a joint region between an electrode and a thermoelectric element, where the thermoelectric element (the n-type semiconductor element 21), included in a thermoelectric module according to another modification of an exemplary embodiment of the present invention, is joined together with the electrode (the lower electrode 12) to a substrate (the lower substrate 32), and under the condition, the fixture 107 is further joined to the upper end surface of the thermoelectric element.

It should be noted that the condition of the thermoelectric module according to the present practical example was produced through a manufacturing step in which a sufficient amount of solder has leaked with respect to the size of each lateral side of the electrode 12 to cover the entire lateral sides of the electrode 12 while solder has spread with wetting even to the lower end surface of the n-type semiconductor element 21 and the face of the substrate 32. The thermoelectric module of the present practical example is different from the thermoelectric modules of the aforementioned practical examples 1 and 2 in that the fillet part 13a of the joint portion 13 is formed in a roughly rectangular shape in a cross-sectional view.

FIG. 12(a) illustrates a condition that the n-type semiconductor element 21 and the lower electrode 12 are joined, as a part of the thermoelectric element according to an exemplary embodiment of the present invention, onto the lower substrate 32 through the joint portion 13 made of solder, and further, the fixture 107 is fixed to the upper end surface of the thermoelectric element.

Figure 12:
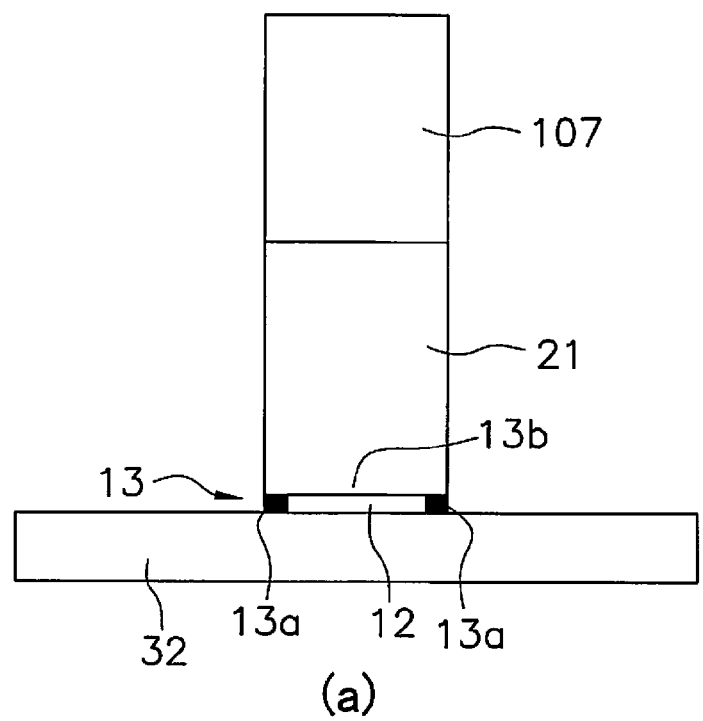
FIG. 12 is composed of FIGS. 12(a) and 12(b)
Figure 12:
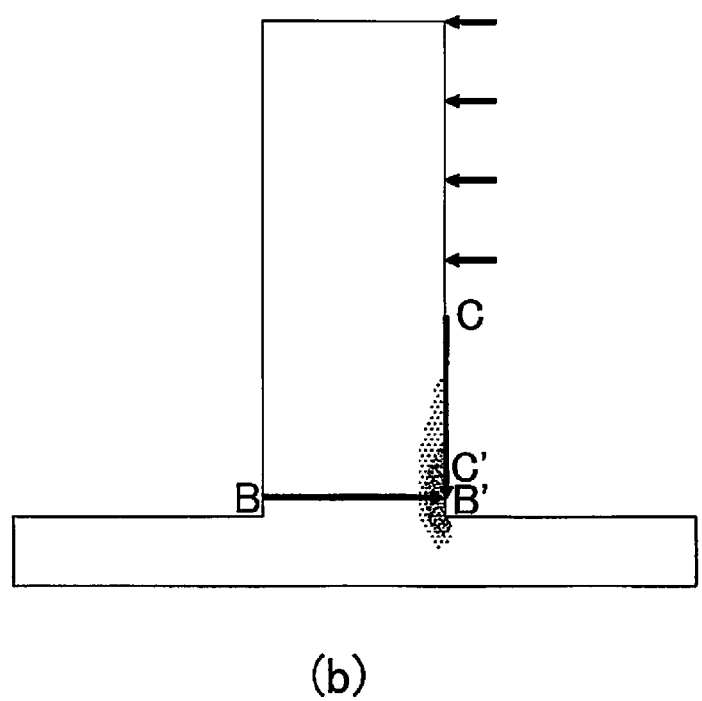
Figure 13:
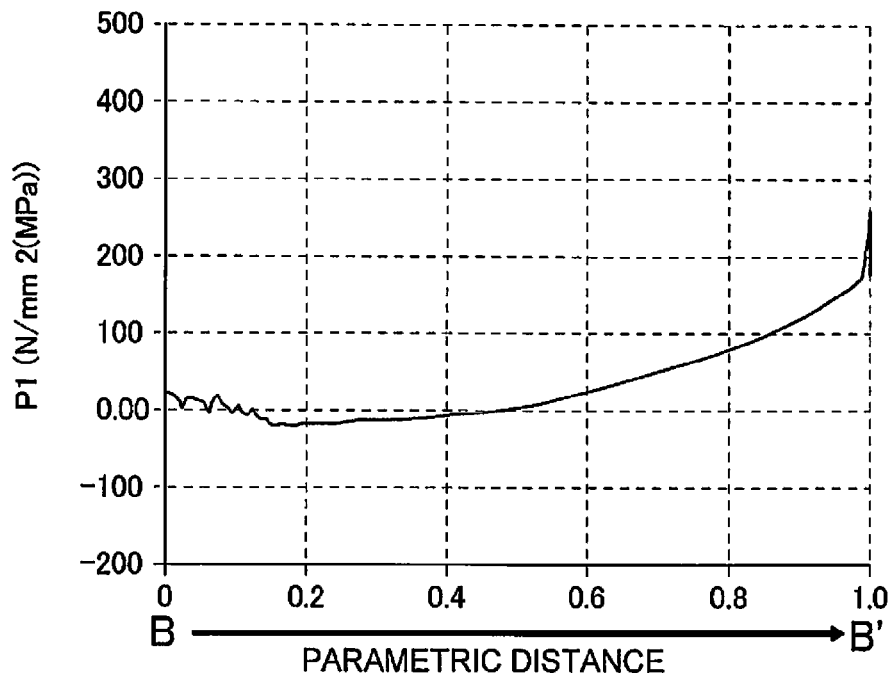
FIG. 13 is composed of FIGS. 13(a) and 13(b)
Figure 13:
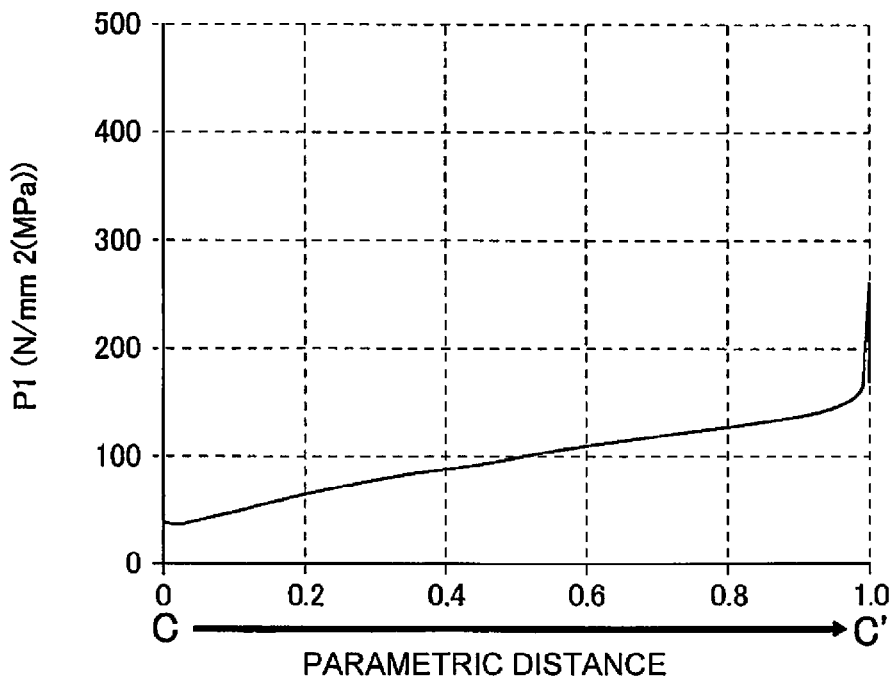
Figure 14:
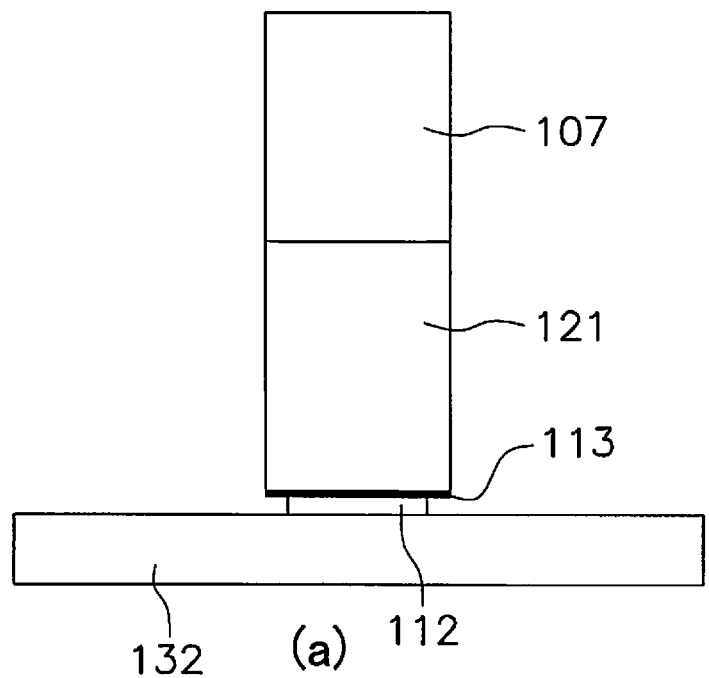
FIG. 14 is composed of FIGS. 14(a) and 14(b)
Figure 14:
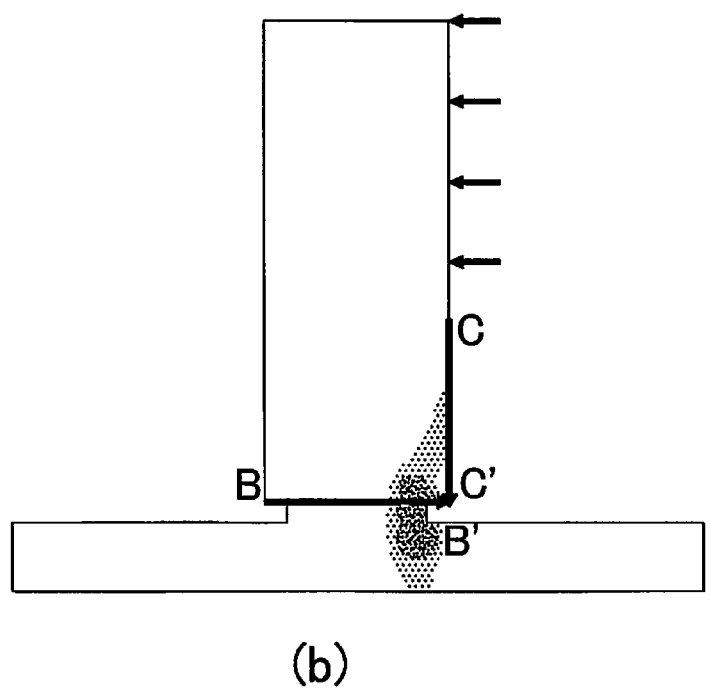
Figure 15:
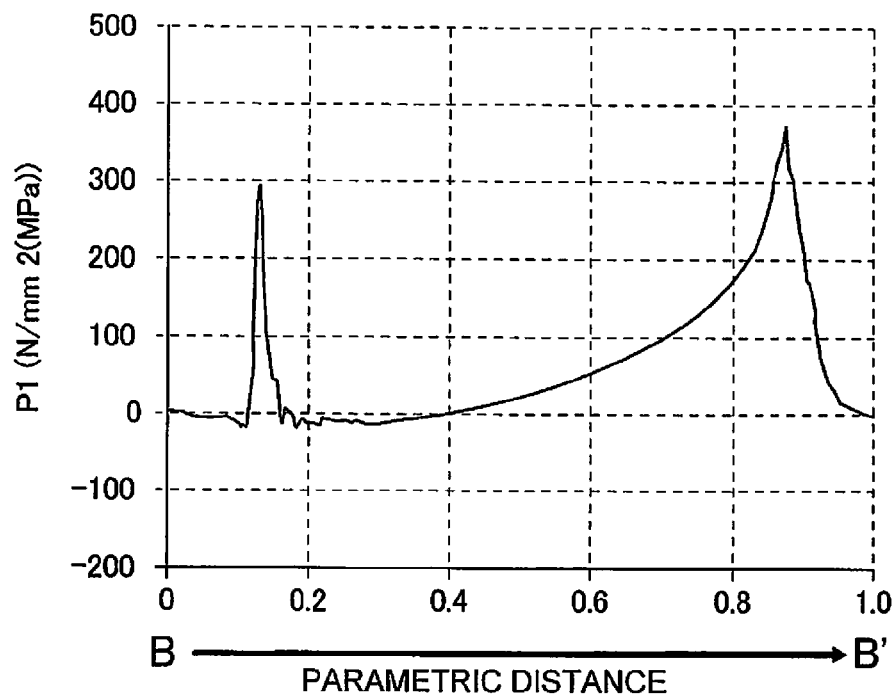
FIG. 15 is composed of FIGS. 15(a) and 15(b)
Figure 15:
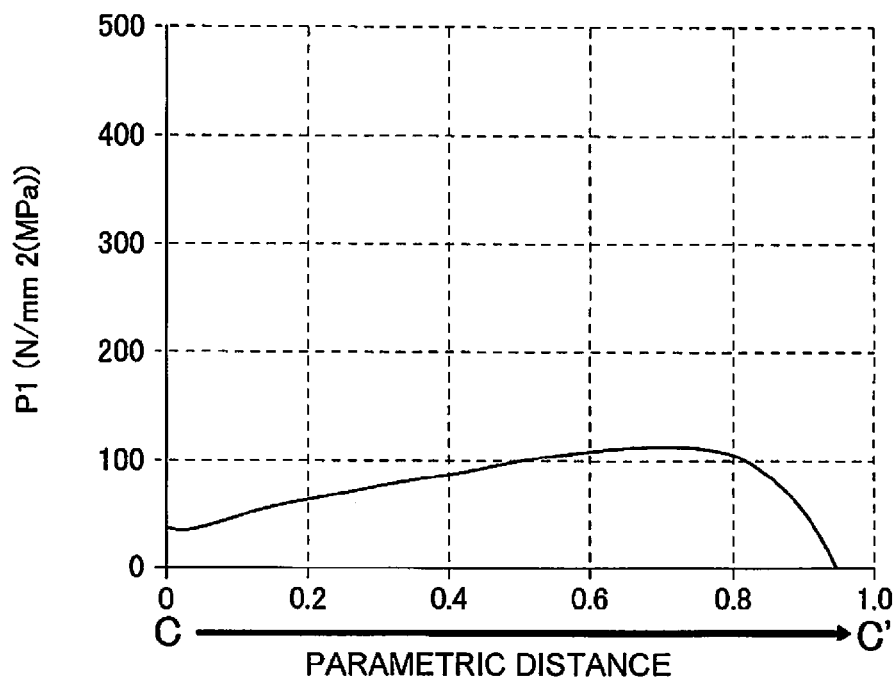
Figure 16:
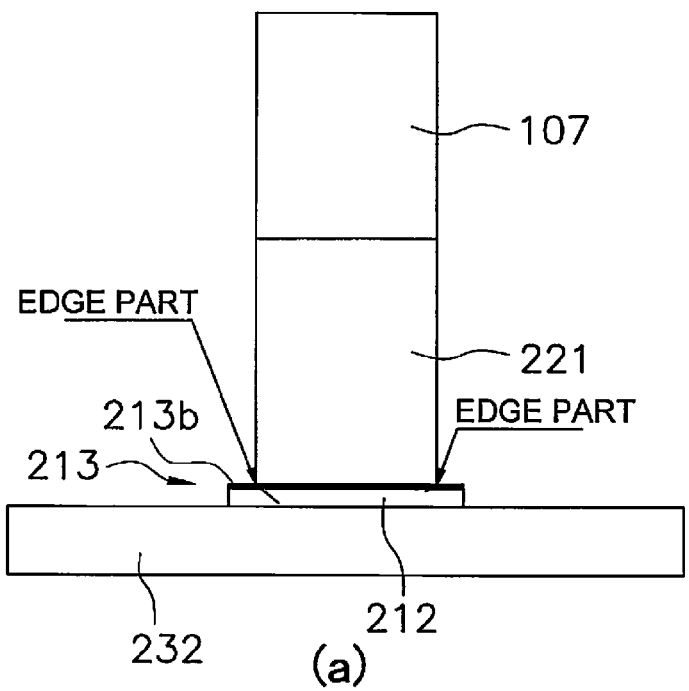
FIG. 16 is composed of FIGS. 16(a) and 16(b)
Figure 16:
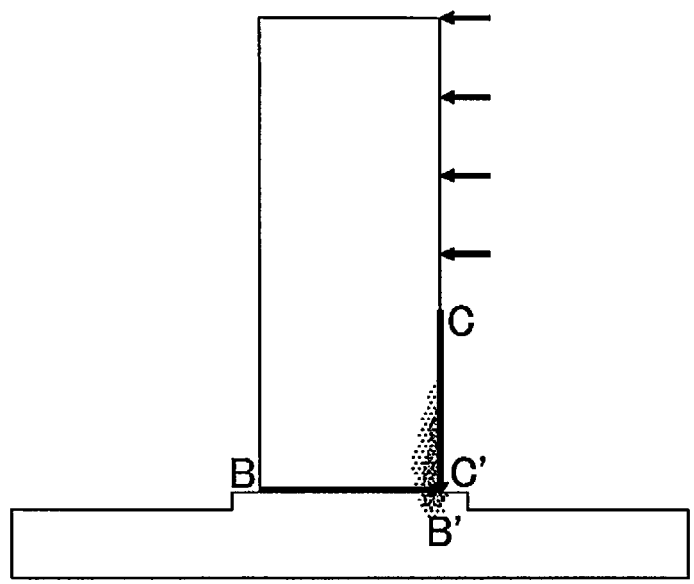
Figure 17:
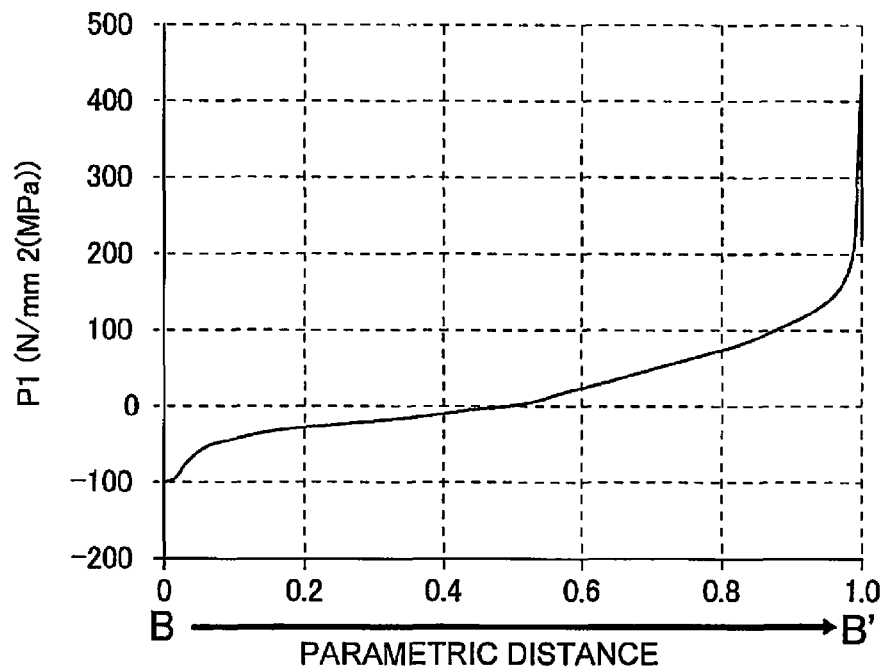
FIG. 17 is composed of FIGS. 17(a) and 17(b)
Figure 17:
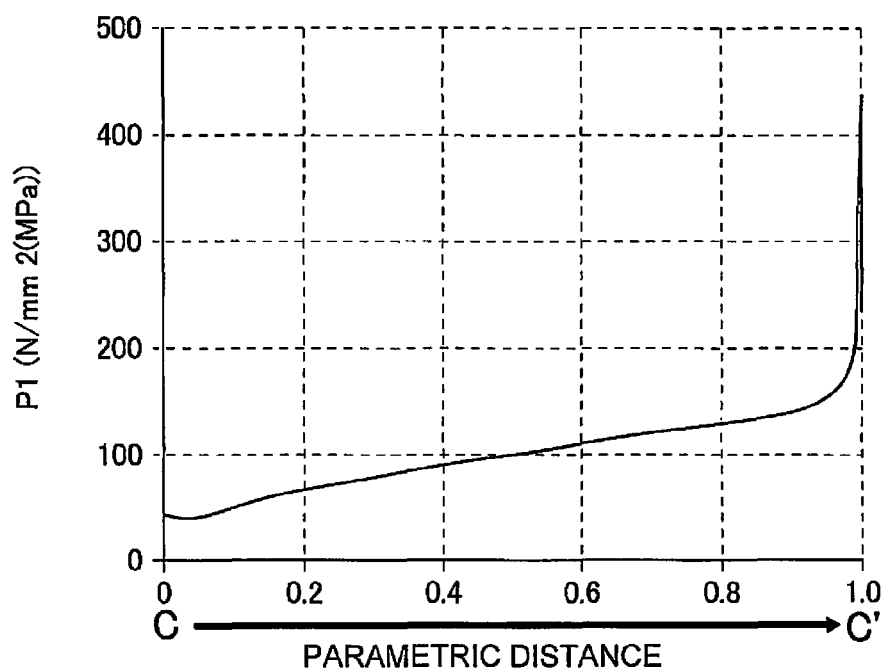

A structure of FIG. 12 (b) corresponds to that of FIG. 12(a), and illustrates a distribution of stress to be induced when a predetermined pressing force is applied in an arrow direction to replicate a condition that bending stress is induced in the entire thermoelectric module in a simulated manner. As illustrated in FIG. 12(b), it is understood that focusing on, and on the vicinity of, the joint region between the lower electrode 12 and the lower end surface of the n-type semiconductor element 21, large stress is induced in the lateral side of the lower electrode 12 and positions closer to the substrate 32 rather than in the n-type semiconductor element 21 and the vicinity thereof.

Thus, according to the structure of the present invention, it was found that even when bending stress is induced in the entire module due to difference in temperature between the top face and the bottom face of the thermoelectric module, stress concentration on the n-type semiconductor element 21 can be avoided, and thus, fracture of the thermoelectric element can be inhibited.

Next, FIG. 13(a) is a chart representing a stress distribution in a direction B-B' in the stress distribution diagram of FIG. 12(b). Specifically in FIG. 13(a), the horizontal axis indicates a parametric distance from a point B to a point B' in FIG. 12(b), whereas the vertical axis indicates the magnitude of stress.

FIG. 13(b) is a chart representing a stress distribution in a direction C-C' in the stress distribution diagram of FIG. 12(b). Specifically in FIG. 13(b), the horizontal axis indicates a parametric distance from a point C to a point C' in FIG. 12(b), whereas the vertical axis indicates the magnitude of stress.

As is obvious from the chart of FIG. 13(a), the stress distribution gently varies although somewhat stress concentrated parts exist in the point B' and the vicinity thereof in the direction B-B' corresponding to the width direction of the n-type semiconductor element 21.

On the other hand, as is obvious from the chart of FIG. 13(b), the stress distribution gently varies although somewhat stress concentrated parts exist in the point C' and the vicinity thereof in the direction C-C' corresponding to the vertical direction of the n-type semiconductor element 21.

Based on the above, it was found that in the thermoelectric element according to the present practical example, small stress concentrated parts exist in the thermoelectric element and the vicinity thereof, but this is not so significant as to result in fracture of the thermoelectric element. As a result, according to the structure of the present practical example, no stress concentrated part exists in the thermoelectric element and the vicinity thereof even when bending stress is induced in the thermoelectric module. Hence, it is possible to prevent fracture of the element attributed to stress concentration.

Comparative Example 1

Next, using FIGS. 14(a) to 15(b), explanation will be made for a result of simulation for verifying a stress distribution in, and in the vicinity of, a joint region between an electrode 112 and a thermoelectric element 121, where the n-type semiconductor element 121, included in a thermoelectric module structured differently from that of the present invention, is joined together with the electrode 112 to a substrate 132, and under the condition, the fixture 107 is further joined to the upper end surface of the n-type thermoelectric element 121.

It should be noted that the condition of the thermoelectric module according to the comparative example was produced through a manufacturing step in which solder has not leaked to the lateral sides of the electrode 112 and has spread with wetting only to the lower end surface of the n-type semiconductor element 121. In this regard, the structure in the comparative example is different from the structures in the aforementioned practical examples 1 to 4.

FIG. 14(a) illustrates a condition that the n-type semiconductor element 121 and the lower electrode 112 are joined, as a part of the thermoelectric element according to the comparative example of the present invention, onto the lower substrate 132 through a joint portion 113 made of solder, and further, the fixture 107 is fixed to the upper end surface of the thermoelectric element.

A structure of FIG. 14(b) corresponds to that of FIG. 14(a), and illustrates a distribution of stress to be induced when a predetermined pressing force is applied in an arrow direction to replicate a condition that bending stress is induced in the entire thermoelectric module in a simulated manner. As illustrated in FIG. 14(b), it is understood that focusing on, and on the vicinity of, the joint region between the lower electrode 112 and the lower end surface of the n-type semiconductor element 121, relatively large stress is induced in the lower end part of the n-type semiconductor element 121 and the vicinity thereof.

Thus, according to the structure of the present comparative example, the following was found. When bending stress is induced in the entire module due to difference in temperature between the top face and the bottom face of the thermoelectric module, chances are that stress is concentrated on the lower end surface of the n-type semiconductor element 121 and the vicinity thereof, and thereby, fracture of the element is caused.

Next, FIG. 15(a) is a chart representing a stress distribution in a direction B-B' in the stress distribution diagram of FIG. 14(b). Specifically in FIG. 15(a), the horizontal axis indicates a parametric distance from a point B to a point B' in FIG. 14(b), whereas the vertical axis indicates the magnitude of stress.

FIG. 15(b) is a chart representing a stress distribution in a direction C-C' in the stress distribution diagram of FIG. 14(b). Specifically in FIG. 15(b), the horizontal axis indicates a parametric distance from a point C to a point C' in FIG. 14(b), whereas the vertical axis indicates the magnitude of stress.

As is obvious from the chart of FIG. 15(a), in the direction B-B' corresponding to the width direction of the n-type semiconductor element 21, stress concentrated parts exist in, and in the vicinity of, the points B and B' corresponding to the both with-directional ends of the n-type semiconductor element 121.

As is obvious from the chart of FIG. 15(b), the stress distribution gently varies in the direction C-C' corresponding to the vertical direction of the n-type semiconductor element 21.

Based on the above, it was found that in the thermoelectric element according to the present comparative example, stress concentrated parts exist in the thermoelectric element and the vicinity thereof, and this possibly results in fracture of the element. As a result, according to the structure of the present comparative example, it was found that, when bending stress is induced in the thermoelectric module, stress concentrated parts are inevitably produced in the thermoelectric element and the vicinity thereof and it is impossible to prevent fracture of the element attributed to stress concentration.

Comparative Example 2

Next, using FIGS. 16(a) to 17(b), explanation will be made for a result of simulation for verifying a stress distribution in, and in the vicinity of, a joint region between a large electrode 212 and an n-type semiconductor element 221, where the n-type semiconductor element 221, included in a thermoelectric module according to another comparative example, is joined together with the large electrode 212 to a substrate 232, and under the condition, the fixture 107 is further joined to the upper end surface of the n-type semiconductor element 221.

It should be noted that the thermoelectric module according to the comparative example has a structure that the area of the large electrode 212 is greater than that of the lower end surface of the n-type semiconductor element 221 in the joint region between the large electrode 212 and the lower end surface of the n-type semiconductor element 221. Further, the condition of the thermoelectric module according to the present comparative example was produced through a manufacturing step in which solder has leaked from the joint region and has spread with wetting only to the upper end surface of the large electrode 212. In this regard, the structure in the comparative example is different from the structures in the aforementioned practical examples 1 to 4.

FIG. 16(a) illustrates a condition that the n-type semiconductor element 221 and the large electrode 212 are joined, as a part of the thermoelectric element according to the present comparative example, onto the lower substrate 232 through a joint portion 213 made of solder, and further, the fixture 107 is fixed to the upper end surface of the n-type semiconductor element 221.

A structure of FIG. 16(b) corresponds to that of FIG. 16(a), and illustrates a distribution of stress to be induced when a predetermined pressing force is applied in an arrow direction to replicate a condition that bending stress is induced in the entire thermoelectric module in a simulated manner. As illustrated in FIG. 16(b), it is understood that focusing on, and on the vicinity of, the joint region between the large electrode 212 and the lower end surface of the n-type semiconductor element 221, relatively large stress is induced in the lower end part of the n-type semiconductor element 221 and the vicinity thereof.

Thus, according to the structure of the present comparative example, the following was found: When bending stress is induced in the entire module due to difference in temperature between the top face and the bottom face of the thermoelectric module, chances are that stress is concentrated on the lower end surface of the n-type semiconductor element 221 and the vicinity thereof, and thereby, fracture of the element is caused.

Next, FIG. 17(a) is a chart representing a stress distribution in a direction B-B' in the stress distribution diagram of FIG. 16(b). Specifically in FIG. 17(a), the horizontal axis indicates a parametric distance from a point B to a point B' in FIG. 16(b), whereas the vertical axis indicates the magnitude of stress.

FIG. 17(b) is a chart representing a stress distribution in a direction C-C' in the stress distribution diagram of FIG. 16(b). Specifically in FIG. 17(b), the horizontal axis indicates a parametric distance from a point C to a point C' in FIG. 16(b), whereas the vertical axis indicates the magnitude of stress.

As is obvious from the chart of FIG. 17(a), in the direction B-B' corresponding to the width direction of the n-type semiconductor element 221, stress concentrated parts exist in, and in the vicinity of, the point B' corresponding to one width-directional end of the n-type semiconductor element 221.

As is obvious from the chart of FIG. 17(b), in the direction C-C' corresponding to the vertical direction of the n-type semiconductor element 221, stress concentrated parts similarly exists in, and in the vicinity of, the point C' corresponding to the lower end part of the n-type semiconductor element 221.

Based on the above, it was found that in the thermoelectric element according to the present comparative example, stress concentrated parts exist in the thermoelectric element and the vicinity thereof, and this possibly results in fracture of the element. As a result, according to the structure of the present comparative example, it was found that, when bending stress is induced in the thermoelectric module, stress concentrated parts are inevitably produced in the thermoelectric element and the vicinity thereof, and it is impossible to prevent fracture of the element attributed to stress concentration.

Other Exemplary Embodiments

One exemplary embodiment of the present invention has been explained above. However the present invention is not limited to the aforementioned exemplary embodiment and a variety of changes can be made without departing from the scope of the present invention.

The aforementioned exemplary embodiment has been explained by exemplifying the thermoelectric module 50 structured with use of the thermoelectric element (the n-type semiconductor element 21, the p-type semiconductor element 22) according exemplary embodiments of the present invention. However, the present invention is not limited to the above.

For example, amongst the plural thermoelectric elements included in the thermoelectric module, the thermoelectric elements of the present invention may be at least used as the thermoelectric elements disposed in the outer peripheral part of the thermoelectric module and the vicinity thereof, whereas the well-known thermoelectric elements may be used as the thermoelectric elements disposed in the middle part of the thermoelectric module and the vicinity thereof.

In the structure, the present invention is applied to the thermoelectric elements disposed on the outer side within the module, i.e., the positions that the largest distortion is caused within the module. Hence, even when thermal stress is induced in the entire thermoelectric module by repeatedly applying voltage to the thermoelectric module, it is possible to effectively avoid problems such as a problem that stress is concentrated on the joint portion between the thermoelectric element and the electrode, and thereby, the thermoelectric element is inevitably damaged or fractured.

The aforementioned exemplary embodiment has been explained by exemplifying the structure using electrodes respectively formed in a roughly I-shape in a plan view as the upper and lower electrodes 11 and 12. However, the present invention is not limited to the above.

For example, electrodes may be used that are formed in another shape, such as a roughly rectangular shape, a round shape and so forth in a plan view.

It should be noted that, when the roughly rectangular electrodes are used, it is desirable to devise the shape of the electrodes, for instance, with use of roughly I-shaped electrodes as with the aforementioned exemplary embodiment, in consideration of suppressing as much as possible a possibility that edges are formed in joining the roughly rectangular electrodes to adjacent pairs of p-type and n-type semiconductor elements by means of solder so as to connect the n-type and p-type semiconductor elements to each other.

The aforementioned exemplary embodiment has been explained by exemplifying the structure that the Ni plated layer 14 and the Au plated layer 15 are formed on the surfaces of the upper and lower electrodes 11 and 12 by means of an electrode surface finishing process for enhancing the wettability of solder. However, the present invention is not limited to the above.

For example, the process for enhancing the wettability of solder on the surfaces of the electrodes is not limited to that explained in the aforementioned exemplary embodiment, because it is possible to achieve an advantageous effect similar to that achieved by the aforementioned exemplary embodiment even when a metal plating process with use of Au, Ag, Sn, Rh, Pd, Ni or so forth is employed.

The aforementioned exemplary embodiment has been explained by exemplifying the structure that, for convenience of manufacturing, a metal surface finishing process has been performed for the lateral sides of the upper and lower electrodes 11 and 12 and the faces thereof opposed to the upper and lower end surfaces of the n-type and p-type semiconductor elements 21 and 22 to enhance the wettability of solder on the surfaces of the upper and lower electrodes 11 and 12. However, the present invention is not limited to the above.

For example, a material with stiffness, such as a copper water-cooled plate processed with a surface insulating treatment, may be used as the substrate for supporting the thermoelectric module of the present invention.

According to the structure of the present invention, solder can be inhibited from making contact with the lateral sides of the p-type and n-type semiconductor elements. Thus, even when the thermoelectric module is left in high-temperature environment, it is possible to inhibit degradation in mechanical strength of the p-type and n-type semiconductor elements attributed to spreading of solder to the p-type and n-type semiconductor elements.

The thermoelectric module of the present invention can achieve an advantageous effect that, even when stress is induced in the entire thermoelectric module due to difference in temperature between the exothermic surface and the endothermic surface of the element portion, the aforementioned shape of the joint portion can avoid stress concentration on the thermoelectric element and the vicinity thereof, and thereby, damage or fracture of the thermoelectric element can be prevented. Hence, the thermoelectric element of the present invention is widely applicable to a variety of devices in which a thermoelectric element utilizing either the Peltier effect or the Seebeck effect is embedded.

The invention claimed is:

1. A thermoelectric element, comprising:
a first element portion and a second element portion, the first element portion being made of a first semiconductor material and the second element portion being made of a second semiconductor material different from the first semiconductor material, the first element portion and the second element portion being arranged adjacently to exhibit either the Peltier effect or the Seebeck effect, each of the first element portion and the second element portion having a first surface and a second surface disposed oppositely to the first surface;
a first electrode and a second electrode, the first electrode being arranged to electrically connect the first surfaces of the first and second element portions together and the second electrode being electrically connected to the second surface of one of the first and second element portions, the first electrode having a pair of first electrode parts that are arranged overlapping the first surface of the first element portion and the first surface of the second electrode portion, respectively, the second electrode having a pair of second electrode parts, one of the second electrode parts being arranged overlapping the second surface of the one of the first element portion and the second element portion, each of the first electrode parts having an area that is smaller than an area of the first surface that the first electrode part overlaps, and each of the second electrode parts having an area that is smaller than an area of the second surface that the one of the second electrode parts overlaps; and
joint portions made of solder that join the first electrode to the first surfaces of the first and second element portions and loin the second electrode to the second surface of the one of the first and second element portions, each of the joint portions having a surface joint part and a fillet part, the surface joint part disposed between the first or second surface of the first or second element portion and a surface of one of the electrode parts of the first or second electrode, respectively, while the electrode part overlaps the first or second surface of the first or second element portion, the fillet part being configured and arranged to fill a step-like space produced between the first or second surface of the first or second element portion and a lateral side of the electrode part, the fillet part being disposed outside an overlapping area between the electrode part and the first or second surface, the fillet part not protruding beyond the first or second surface in a direction parallel to the first or second surface.

2. The thermoelectric element recited in claim 1, wherein each of the first and second electrodes has a roughly 1-shape.

3. The thermoelectric element recited in claim 1, wherein the lateral side of each of the electrode parts is processed with a surface finishing process for enhancing wettability of the solder.

4. The thermoelectric element recited in claim 3, wherein the surface finishing process is a plating process containing any one selected from the group consisting of Au, Ag, Sn, Rh, Pd, Ni and a solder plating material.

5. The thermoelectric element recited in claim 1, wherein the fillet part is formed to cover the lateral side of the electrode part.

6. A thermoelectric module, comprising:
the thermoelectric element recited in claim 1; and
a substrate on which a plurality of the thermoelectric elements are regularly aligned.

7. The thermoelectric module recited in claim 6, wherein the plurality of the thermoelectric elements are disposed at least on an outer side within the thermoelectric module.

8. The thermoelectric module recited in claim 6, wherein the fillet part is formed to cover the lateral side of the electrode part.

9. The thermoelectric module recited in claim 8, wherein the plurality of the thermoelectric elements are disposed at least on an outer side within the thermoelectric module.

10. The thermoelectric element recited in claim 2, wherein the lateral side of each of the electrode parts is processed with a surface finishing process for enhancing wettability of the solder.

11. The thermoelectric element recited in claim 10, wherein the surface finishing process is a plating process containing any one selected from the group consisting of Au, Ag, Sn, Rh, Pd, Ni and a solder plating material.

12. The thermoelectric element recited in claim 2, wherein the fillet part is formed to cover the lateral side of the electrode part.

13. A thermoelectric module, comprising:
the thermoelectric element recited in claim 2; and
a substrate on which a plurality of the thermoelectric elements are regularly aligned.

14. The thermoelectric module recited in claim 13, wherein the plurality of the thermoelectric elements are disposed at least on an outer side within the thermoelectric module.

15. The thermoelectric module recited in claim 13, wherein the fillet part is formed to cover the lateral side of the electrode part.

16. The thermoelectric module recited in claim 15, wherein the plurality of the thermoelectric elements are disposed at least on an outer side within thermoelectric the module.

17. The thermoelectric element recited in claim 1, wherein
The first semiconductor material is an n-type semiconductor material, and the second semiconductor material is a p-type semiconductor material.

18. The thermoelectric module recited in claim 1, wherein the fillet part is formed to cover only a portion of the lateral side of the electrode part.

19. The thermoelectric module recited in claim 1, wherein the fillet part is formed to have a triangular shape in a cross sectional view.

20. The thermoelectric module recited in claim 1, wherein the fillet part is formed to have a rectangular shape in a cross sectional view.

* * * * *